(12) United States Patent
Sadaka

(10) Patent No.: US 8,637,995 B2
(45) Date of Patent: Jan. 28, 2014

(54) BONDED SEMICONDUCTOR STRUCTURES INCLUDING TWO OR MORE PROCESSED SEMICONDUCTOR STRUCTURES CARRIED BY A COMMON SUBSTRATE

(71) Applicants: Soitec, Crolles Cedex (FR); Mariam Sadaka, Austin, TX (US)

(72) Inventor: Mariam Sadaka, Austin, TX (US)

(73) Assignee: SOITEC, Bernin (FR)

( * ) Notice: Subject to any disclaimer, the term of this patent is extended or adjusted under 35 U.S.C. 154(b) by 0 days.

(21) Appl. No.: 13/657,327

(22) Filed: Oct. 22, 2012

(65) Prior Publication Data

US 2013/0043600 A1    Feb. 21, 2013

Related U.S. Application Data

(62) Division of application No. 13/077,364, filed on Mar. 31, 2011, now Pat. No. 8,338,294.

(51) Int. Cl.
*H01L 23/52* (2006.01)
*H01L 23/48* (2006.01)
*H01L 29/40* (2006.01)

(52) U.S. Cl.
USPC .................. 257/774; 257/E23.174; 257/723; 257/773; 438/667; 438/672; 438/675

(58) Field of Classification Search
USPC .......... 257/E23.174, 687, 700–702, 723, 737, 257/773, 774; 438/107, 113, 114, 122, 124, 438/667, 672, 675; 361/761, 763, 783
See application file for complete search history.

(56) References Cited

U.S. PATENT DOCUMENTS

| | | | |
|---|---|---|---|
| 5,432,677 | A | 7/1995 | Mowatt et al. |
| 6,184,577 | B1 | 2/2001 | Takemura et al. |
| 6,303,468 | B1 | 10/2001 | Aspar |
| 6,335,258 | B1 | 1/2002 | Aspar et al. |
| 6,642,081 | B1 | 11/2003 | Patti |

(Continued)

FOREIGN PATENT DOCUMENTS

| | | |
|---|---|---|
| DE | 19853703 A1 | 5/2000 |
| FR | 2910704 A1 | 6/2008 |
| WO | 2010047228 A1 | 4/2010 |

OTHER PUBLICATIONS

French Opinion for French Application No. 1153080 dated Nov. 23, 2011, 3 pages.

(Continued)

*Primary Examiner* — Chris Chu
(74) *Attorney, Agent, or Firm* — Traskbritt, P.C.

(57) ABSTRACT

Methods of forming semiconductor devices include providing a substrate including a layer of semiconductor material on a layer of electrically insulating material. A first metallization layer is formed over a first side of the layer of semiconductor material. Through wafer interconnects are foamed at least partially through the substrate. A second metallization layer is formed over a second side of the layer of semiconductor material opposite the first side thereof. An electrical pathway is provided that extends through the first metallization layer, the substrate, and the second metallization layer between a first processed semiconductor structure carried by the substrate on the first side of the layer of semiconductor material and a second processed semiconductor structure carried by the substrate on the first side of the layer of semiconductor material. Semiconductor structures are fabricated using such methods.

11 Claims, 12 Drawing Sheets

(56) References Cited

U.S. PATENT DOCUMENTS

| | | | |
|---|---|---|---|
| 6,756,286 B1 | 6/2004 | Moriceau et al. | |
| 6,791,178 B2 | 9/2004 | Yamaguchi et al. | |
| 6,809,044 B1 | 10/2004 | Aspar et al. | |
| 6,946,365 B2 | 9/2005 | Aspar | |
| 7,050,304 B2 | 5/2006 | Hsu et al. | |
| RE39,484 E | 2/2007 | Bruel | |
| 7,242,092 B2 | 7/2007 | Hsu | |
| 7,354,798 B2 * | 4/2008 | Pogge et al. | 438/109 |
| 7,605,458 B1 * | 10/2009 | Rahman et al. | 257/686 |
| 7,786,571 B2 | 8/2010 | Chou et al. | |
| 7,825,024 B2 * | 11/2010 | Lin et al. | 438/637 |
| 7,843,068 B2 | 11/2010 | Murayama et al. | |
| 7,847,626 B2 * | 12/2010 | Alzheimer et al. | 327/566 |
| 7,898,095 B2 * | 3/2011 | Patti et al. | 257/797 |
| 7,956,448 B2 | 6/2011 | Yu et al. | |
| 8,049,296 B2 * | 11/2011 | Miyakawa et al. | 257/508 |
| 8,174,108 B2 * | 5/2012 | O'Neill | 257/686 |
| 8,288,250 B2 | 10/2012 | Clavelier et al. | |
| 8,314,483 B2 * | 11/2012 | Lin et al. | 257/686 |
| 8,405,226 B2 * | 3/2013 | Knickerbocker et al. | 257/777 |
| 2002/0001937 A1 | 1/2002 | Kikuchi et al. | |
| 2002/0003232 A1 | 1/2002 | Ahn | |
| 2002/0102816 A1 | 8/2002 | Gonzalez | |
| 2002/0119640 A1 | 8/2002 | Gonzalez | |
| 2003/0129829 A1 | 7/2003 | Greenlaw | |
| 2003/0157748 A1 | 8/2003 | Kim et al. | |
| 2003/0193076 A1 | 10/2003 | Patti | |
| 2005/0110159 A1 | 5/2005 | Oh et al. | |
| 2005/0258548 A1 | 11/2005 | Ogawa et al. | |
| 2006/0105496 A1 | 5/2006 | Chen et al. | |
| 2006/0197181 A1 | 9/2006 | Noguchi | |
| 2007/0096292 A1 | 5/2007 | Machida | |
| 2007/0224776 A1 | 9/2007 | Chiou | |
| 2007/0284747 A1 | 12/2007 | Yao et al. | |
| 2008/0079157 A1 | 4/2008 | Kurita et al. | |
| 2008/0157341 A1 | 7/2008 | Yang et al. | |
| 2008/0315230 A1 | 12/2008 | Murayama | |
| 2010/0006331 A1 | 1/2010 | Hsu | |
| 2010/0075461 A1 | 3/2010 | Clavelier et al. | |
| 2010/0213578 A1 | 8/2010 | Sandhu et al. | |
| 2010/0225001 A1 | 9/2010 | Hizume | |
| 2010/0252937 A1 | 10/2010 | Uchiyama | |
| 2010/0295136 A1 | 11/2010 | Or-Bach et al. | |
| 2010/0314737 A1 | 12/2010 | Henderson et al. | |
| 2010/0327463 A1 | 12/2010 | Yu et al. | |
| 2012/0220102 A1 | 8/2012 | Or-Bach et al. | |
| 2012/0248621 A1 * | 10/2012 | Sadaka | 257/774 |
| 2012/0248622 A1 | 10/2012 | Sadaka | |

OTHER PUBLICATIONS

French Preliminary Search Report for French Application No. 1153080 dated Nov. 23, 2011, 3 pages.

Rao et al., TSV Interposer Fabrication for 3D IC Packaging, 11th Electronics Packaging Technology Conference, 2009, pp. 431-437.

Sunohara et al., Silicon Interposer with TSVs (Through Silicon Vias) and Fine Multilayer Wiring, Electronic Components and Technology, Conference, 2008, pp. 847-852.

* cited by examiner

BONDED SEMICONDUCTOR STRUCTURES INCLUDING TWO OR MORE PROCESSED SEMICONDUCTOR STRUCTURES CARRIED BY A COMMON SUBSTRATE

CROSS-REFERENCE TO RELATED APPLICATION

This application is a divisional of U.S. patent application Ser. No. 13/077,364, filed Mar. 31, 2011, now U.S. Pat. No. 8,338,294, issued Dec. 25, 2012, the disclosure of which is hereby incorporated herein by this reference in its entirety.

TECHNICAL FIELD

Embodiments of the present disclosure generally relate to methods of forming semiconductor devices that include two or more semiconductor structures bonded to a common substrate, and to semiconductor devices formed by such methods.

BACKGROUND

The three-dimensional (3D) integration of two or more semiconductor structures can produce a number of benefits to microelectronic applications. For example, 3D integration of microelectronic components can result in improved electrical performance and power consumption while reducing the area of the device footprint. See, for example, P. Garrou et al., "The Handbook of 3D Integration," Wiley-VCH (2008).

The 3D integration of semiconductor structures may take place by the attachment of a semiconductor die to one or more additional semiconductor dice (i.e., die-to-die (D2D)), a semiconductor die to one or more semiconductor wafers (i.e., die-to-wafer (D2W)), as well as a semiconductor wafer to one or more additional semiconductor wafers (i.e., wafer-to-wafer (W2W)), or a combination thereof.

Often, the individual semiconductor structures (e.g., dice or wafers) may be relatively thin and difficult to handle with equipment for processing the semiconductor structures. Thus, so-called "carrier" dice or wafers may be attached to the actual semiconductor structures that include therein the active and passive components of operative semiconductor devices. The carrier dice or wafers do not typically include any active or passive components of a semiconductor device to be formed. Such carrier dice and wafers are referred to herein as "carrier substrates." The carrier substrates increase the overall thickness of the semiconductor structures and facilitate handling of the semiconductor structures (by providing structural support to the relatively thinner semiconductor structures) by processing equipment used to process the active and/or passive components in the semiconductor structures attached thereto that will include the active and passive components of a semiconductor device to be fabricated thereon. Such semiconductor structures that will ultimately include the active and/or passive components of a semiconductor device to be fabricated thereon, or that will ultimately include the active and/or passive components of a semiconductor device to be fabricated thereon upon completion of the manufacturing process, are referred to herein as "device substrates."

The bonding techniques used in bonding one semiconductor structure to another semiconductor structure may be categorized in different ways, one being whether a layer of intermediate material is provided between the two semiconductor structures to bond them together, and the second being whether the bonding interface allows electrons (i.e., electrical current) to pass through the interface. So called "direct bonding methods" are methods in which a direct solid-to-solid chemical bond is established between two semiconductor structures to bond them together without using an intermediate bonding material between the two semiconductor structures to bond them together. Direct metal-to-metal bonding methods have been developed for bonding metal material at a surface of a first semiconductor structure to metal material at a surface of a second semiconductor structure.

Direct metal-to-metal bonding methods may also be categorized by the temperature range in which each is carried out. For example, some direct metal-to-metal bonding methods are carried out at relatively high temperatures resulting in at least partial melting of the metal material at the bonding interface. Such direct bonding processes may be undesirable for use in bonding processed semiconductor structures that include one or more device structures, as the relatively high temperatures may adversely affect the earlier formed device structures.

"Thermo-compression" bonding methods are direct bonding methods in which pressure is applied between the bonding surfaces at elevated temperatures between two hundred degrees Celsius (200° C.) and about five hundred degrees Celsius (500° C.), and often between about three hundred degrees Celsius (300° C.) and about four hundred degrees Celsius (400° C.).

Additional direct bonding methods have been developed that may be carried out at temperatures of two hundred degrees Celsius (200° C.) or less. Such direct bonding processes carried out at temperatures of two hundred degrees Celsius (200° C.) or less are referred to herein as "ultra-low temperature" direct bonding methods. Ultra-low temperature direct bonding methods may be carried out by careful removal of surface impurities and surface compounds (e.g., native oxides), and by increasing the area of intimate contact between the two surfaces at the atomic scale. The area of intimate contact between the two surfaces is generally accomplished by polishing the bonding surfaces to reduce the surface roughness up to values close to the atomic scale, by applying pressure between the bonding surfaces resulting in plastic deformation, or by both polishing the bonding surfaces and applying pressure to attain such plastic deformation.

Some ultra-low temperature direct bonding methods may be carried out without applying pressure between the bonding surfaces at the bonding interface, although pressure may be applied between the bonding surfaces at the bonding interface in other ultra-low temperature direct bonding methods in order to achieve a suitable bond strength at the bonding interface. Ultra-low temperature direct bonding methods in which pressure is applied between the bonding surfaces are often referred to in the art as "surface assisted bonding" or "SAB" methods. Thus, as used herein, the terms "surface assisted bonding" and "SAB" mean and include any direct bonding process in which a first material is directly bonded to a second material by abutting the first material against the second material and applying pressure between the bonding surfaces at the bonding interface at a temperature of two hundred degrees Celsius (200° C.) or less.

Carrier substrates are typically attached to device substrates using an adhesive. Similar bonding methods may also be used to secure one semiconductor structure that includes active and/or passive components of one or more semiconductor devices therein to another semiconductor structure that also includes active and/or passive components of one or more semiconductor devices therein.

Semiconductor dice may have electrical connections that do not match the connections on other semiconductor structures to which they are to be connected. An interposer (L e., an additional structure) may be placed between two semiconductor structures or between any semiconductor die and a semiconductor package to reroute and align appropriate electrical connections. The interposer may have one or more conductive traces and vias used to make proper contact between the desired semiconductor structures.

BRIEF SUMMARY

Embodiments of the present disclosure may provide methods and structures for forming semiconductor devices that include two or more semiconductor structures that are carried by a common substrate. An electrical connection may be provided between two or more of the semiconductor structures through the common substrate. This summary is provided to introduce a selection of concepts, in a simplified form, that are further described in the detailed description of embodiments of the disclosure. This summary is not intended to identify key features or essential features of the claimed subject matter, nor is it intended to be used to limit the scope of the claimed subject matter.

In some embodiments, the present disclosure includes methods of forming a semiconductor device. In accordance with such methods, a substrate may be provided that includes a layer of semiconductor material on a layer of electrically insulating material. A first metallization layer including a plurality of electrically conductive features may be formed on the substrate over a first side of the layer of semiconductor material opposite the layer of electrically insulating material. A plurality of through wafer interconnects may be formed at least partially through the substrate. At least one of the through wafer interconnects may be foamed to extend through each of the metallization layer and the layer of semiconductor material. A second metallization layer including a plurality of electrically conductive features may be formed on the substrate over a second side of the layer of semiconductor material opposite the first side of the layer of semiconductor material. An electrical pathway is provided (e.g., formed) that extends continuously through the first metallization layer, the substrate, and the second metallization layer between a first processed semiconductor structure carried by the substrate on the first side of the layer of semiconductor material and a second processed semiconductor structure carried by the substrate on the first side of the layer of semiconductor material.

In additional embodiments, the present disclosure includes semiconductor structures that are formed using methods as described herein. For example, in additional embodiments, the present disclosure includes semiconductor devices that include a substrate comprising a layer of semiconductor material, a first metallization layer on the substrate over a first side of the layer of semiconductor material, and a second metallization layer on the substrate over a second side of the layer of semiconductor material opposite the first side of the layer of semiconductor material. A plurality of through wafer interconnects extend at least partially through each of the first metallization layer and the layer of semiconductor material of the substrate. A first processed semiconductor structure may be carried by the substrate over the first side of the layer of semiconductor material, and a second processed semiconductor structure also may be carried by the substrate over the first side of the layer of semiconductor material. At least one electrical pathway may extend from the first processed semiconductor structure, through a conductive feature of the first metallization layer, through a first through wafer interconnect of the plurality of through wafer interconnects, through a conductive feature of the second metallization layer, and through a second through wafer interconnect of the plurality of through wafer interconnects to the second processed semiconductor structure.

BRIEF DESCRIPTION OF THE DRAWINGS

Embodiments of the present disclosure may be understood more fully by reference to the following detailed description of embodiments of the present disclosure and the appended figures in which:

FIG. 6A illustrates the fabrication of through wafer interconnects through the first metallization layer and the layer of semiconductor material of the SeOI substrate shown in FIG. 5;

FIG. 6B illustrates the bonding of a carrier substrate over the first metallization layer on a side thereof opposite the SeOI substrate;

FIG. 6C illustrates removal of a portion of the SeOI substrate to expose the through wafer interconnects through the structure on a side thereof opposite the carrier substrate;

FIG. 6D illustrates a second metallization layer formed over the layer of semiconductor material of the SeOI substrate on a side thereof opposite the first metallization layer;

FIG. 6E illustrates removal of the carrier wafer and other portions of the structure shown in FIG. 6D;

FIG. 6F illustrates additional processed semiconductor structures bonded to, and electrically coupled with, the structure of FIG. 6E over a first side of the layer of semiconductor material of the SeOI substrate, and further illustrates the bonding and electrical coupling of the semiconductor structure with another substrate on the second side of the layer of semiconductor material of the SeOI substrate;

DETAILED DESCRIPTION

Figure 1:
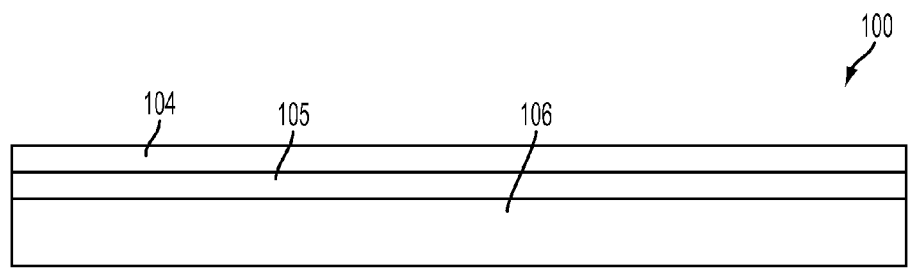
FIG. 1 is a simplified cross-sectional view of a semiconductor-on-insulator (SeOI) substrate that may be employed in embodiments of methods of the disclosure.

The illustrations presented herein are not meant to be actual views of any particular material, device, system, or method, but are merely idealized representations that are used to describe embodiments of the disclosure.

Any headings used herein should not be considered to limit the scope of embodiments of the invention, as defined by the claims below and their legal equivalents. Concepts described in any specific heading are generally applicable in other sections throughout the entire specification.

A number of references are cited herein, the entire disclosures of which are incorporated herein, in their entirety, by this reference for all purposes. Further, none of the cited references, regardless of how characterized herein, is admitted as prior art relative to the disclosure of the subject matter claimed herein.

As used herein, the term "semiconductor device" means and includes any operative device comprising one or more semiconductor materials that is capable of performing one or more functions when properly and functionally integrated into an electronic or optoelectronic device or system. Semiconductor devices include, but are not limited to, electronic signal processors, memory devices (e.g., random access memory (RAM), dynamic random access memory (DRAM), Flash memory, etc.), optoelectronic devices (e.g., light-emitting diodes, laser-emitting diodes, solar cells, etc.), and devices that include two or more such devices operatively connected with one another.

As used herein, the term "semiconductor structure" means and includes any structure that is used or formed during the fabrication of a semiconductor device. Semiconductor structures include, for example, dies and wafers (for example, carrier substrates and device substrates), as well as assemblies or composite structures that include two or more dies and/or wafers three-dimensionally integrated with one another. Semiconductor structures also include fully fabricated semiconductor devices, as well as intermediate structures formed during fabrication of semiconductor devices.

As used herein, the term "processed semiconductor structure" means and includes any semiconductor structure that includes one or more at least partially formed device structures. Processed semiconductor structures are a subset of semiconductor structures, and all processed semiconductor structures are semiconductor structures.

As used herein, the term "bonded semiconductor structure" means and includes any structure that includes two or more semiconductor structures that are attached together. Bonded semiconductor structures are a subset of semiconductor structures, and all bonded semiconductor structures are semiconductor structures. Furthermore, bonded semiconductor structures that include one or more processed semiconductor structures are also processed semiconductor structures.

As used herein, the term "device structure" means and includes any portion of a processed semiconductor structure that is, includes, or defines at least a portion of an active or passive component of a semiconductor device to be formed on or in the semiconductor structure. For example, device structures include active and passive components of integrated circuits such as, for example, transistors, transducers, capacitors, resistors, conductive lines, conductive vias, and conductive contact pads.

As used herein, the term "through wafer interconnect" or "TWI" means and includes any conductive via extending through at least a portion of a first semiconductor structure that is used to provide a structural and/or an electrical interconnection between the first semiconductor structure and a second semiconductor structure across an interface between the first semiconductor structure and the second semiconductor structure. Through wafer interconnects are also referred to in the art by other terms such as "through silicon/substrate vias" or "TSVs," and "through wafer vias" or "TWVs." TWIs typically extend through a semiconductor structure in a direction generally perpendicular to the generally flat, major surfaces of the semiconductor structure (in a direction parallel to the Z-axis).

As used herein, the term "active surface," when used in relation to a processed semiconductor structure, means and includes an exposed major surface of the processed semiconductor structure that has been, or will be, processed to form one or more device structures in and/or on the exposed major surface of the processed semiconductor structure.

As used herein, the term "metallization layer" means and includes a layer of a processed semiconductor structure that includes one or more of conductive lines, conductive vias, and conductive contact pads, which are used for conducting current along at least a portion of an electrical pathway.

As used herein, the term "back surface," when used in relation to a processed semiconductor structure, means and includes an exposed major surface of the processed semiconductor structure on an opposing side of the processed semiconductor structure from an active surface of the semiconductor structure.

As used herein, the term "III-V type semiconductor material" means and includes any material predominantly comprised of one or more elements from group IIIA of the periodic table (B, Al, Ga, In, and Ti) and one or more elements from group VA of the periodic table (N, P, As, Sb, and Bi).

Embodiments of the disclosure comprise methods and structures for forming semiconductor structures and, more particularly, semiconductor structures that include bonded semiconductor structures and methods of forming such bonded semiconductor structures.

In some embodiments, through wafer interconnects are formed through at least a portion of a semiconductor-on-insulator (SeOI) substrate, and one or more metallization layers are formed over at least a portion of the SeOI substrate. Processed semiconductor structures (e.g., semiconductor devices) may be carried by at least a portion of the SeOI substrate, and electrical pathways between the processed semiconductor structures (and, optionally, other structures or substrates) may be established using conductive features of the metallization layers and the through wafer interconnects. Embodiments of the methods and the structures of the disclosure may be utilized for various purposes, such as, for example, for 3D integration processes and to form 3D integrated structures.

FIG. 1 illustrates a substrate 100 that may be employed in embodiments of the present disclosure. The substrate 100 includes a relatively thin layer of semiconductor material 104. In some embodiments, the layer of semiconductor material 104 may be at least substantially single crystal semiconductor material.

By way of example and not limitation, the layer of semiconductor material 104 may comprise single crystal silicon, germanium, or a III-V semiconductor material, and may be doped or undoped. In some embodiments, the layer of semiconductor material 104 may comprise an epitaxial layer of semiconductor material.

In some embodiments, the layer of semiconductor material 104 may have an average total thickness of about one micron (1 µm) or less, about five hundred nanometers (500 nm) or less, or even about ten nanometers (10 nm) or less.

Optionally, the layer of semiconductor material 104 may be disposed over and carried by a base 106. By way of example and not limitation, the base 106 may comprise one or more dielectric materials such as an oxide (e.g., silicon oxide ($SiO_2$) or aluminum oxide ($Al_2O_3$)), a nitride (e.g., silicon nitride ($Si_3N_4$) or boron nitride (BN)), etc. In additional embodiments, the base 106 may comprise a semiconductor material, such as any of those mentioned above in relation to the semiconductor material 104. The base 106 also may comprise a multilayer structure including two or more different materials in some embodiments.

In some embodiments, the substrate 100 may comprise what is referred to in the art as a "semiconductor-on-insulator" (SeOI) type substrate. For example, the substrate 100 may comprise what is referred to in the art as a "silicon-on-insulator" (SOI) type substrate. In such embodiments, a layer of electrically insulating material 105 may be disposed between the layer of semiconductor material 104 and a base 106. The electrically insulating material 105 may comprise what is referred to in the art as a "buried oxide" layer (BOX). The electrically insulating material 105 may comprise, for example, a ceramic material such as a nitride (silicon nitride (e.g., $Si_3N_4$)) or an oxide (e.g., silicon oxide ($SiO_2$) or aluminum oxide ($Al_2O_3$)). In some embodiments, the layer of electrically insulating material 105 may have an average total thickness of about one micron (1 µm) or less, about three hundred nanometers (300 nm) or less, or even about ten nanometers (10 nm) or less.

Figure 2:
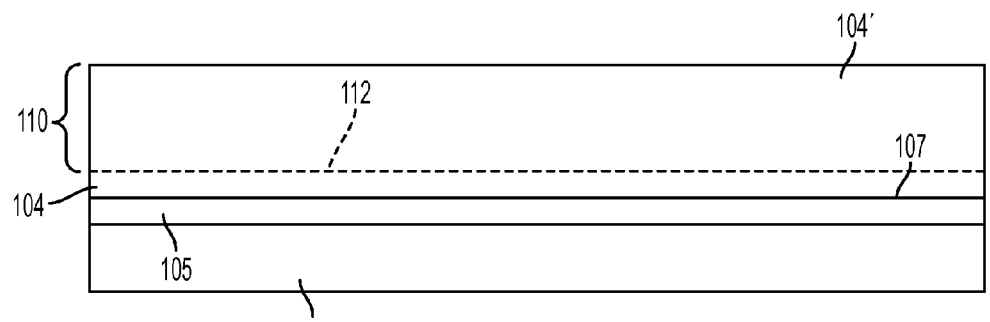
FIG. 2 is a simplified cross-sectional view illustrating a method that may be used to fabricate the SeOI substrate of FIG. 1.

As a non-limiting example, the substrate 100 shown in FIG. 1 may be formed using what is referred to in the art as the SMARTCUT® process. For example, as shown in FIG. 2, a relatively thick layer of semiconductor material 104' may be bonded to an exposed major surface 107 of the layer of electrically insulating material 105. The relatively thick layer of semiconductor material 104' may have a composition identical to that of the layer of semiconductor material 104 to be provided over the base 106, and the layer of semiconductor material 104 may be formed from, and comprise a relatively thinner portion of, the relatively thick layer of semiconductor material 104'.

In some embodiments, a bonding material (not shown) may be used to bond the relatively thick layer of semiconductor material 104' to the major surface 107 of the layer of electrically insulating material 105. Such a bonding material may comprise one or more of, for example, silicon oxide, silicon nitride, and mixtures thereof. Such a bonding material may be formed or otherwise provided over one or both of the abutting surfaces of the layer of electrically insulating material 105 and the relatively thick layer of semiconductor material 104' to improve the bond therebetween.

In some embodiments, the relatively thick layer of semiconductor material 104' may be bonded to the layer of electrically insulating material 105 at a temperature of about 400° C. or less, or even at about 350° C. or less. In other embodiments, however, the bonding process may be carried out at higher temperatures.

After bonding the relatively thick layer of semiconductor material 104' to the layer of electrically insulating material 105, the relatively thick layer of semiconductor material 104' may be thinned to form the relatively thin layer of semiconductor 104 of FIG. 1. A portion 110 of the relatively thick layer of semiconductor material 104' may be removed from the relatively thin layer of semiconductor material 104, leaving the relatively thin layer of semiconductor material 104 behind on the surface 107 of the electrically insulating material 105.

By way of example and not limitation, the SMARTCUT® process may be used to separate the portion 110 of the relatively thick layer of semiconductor material 104' from the relatively thinner layer of semiconductor material 104, the layer of electrically insulating material 105, and the base 106. Such processes are described in detail in, for example, U.S. Pat. No. RE39,484 to Bruel (issued Feb. 6, 2007), U.S. Pat. No. 6,303,468 to Aspar et al. (issued Oct. 16, 2001), U.S. Pat. No. 6,335,258 to Aspar et al. (issued Jan. 1, 2002), U.S. Pat. No. 6,756,286 to Moriceau et al. (issued Jun. 29, 2004), U.S. Pat. No. 6,809,044 to Aspar et al. (issued Oct. 26, 2004), and U.S. Pat. No. 6,946,365 to Aspar et al. (Sep. 20, 2005), the disclosures of which are incorporated herein in their entireties by this reference.

Briefly, a plurality of ions (e.g., one or more of hydrogen, helium, or inert gas ions) may be implanted into the layer of semiconductor material 104' along an ion implant plane 112. In some embodiments, the plurality of ions may be implanted into the layer of semiconductor material 104' prior to bonding the layer of semiconductor material 104' to the layer of electrically insulating material 105 and the base 106.

Ions may be implanted along a direction substantially perpendicular to the layer of semiconductor material 104'. As known in the art, the depth at which the ions are implanted into the layer of semiconductor material 104' is at least partially a function of the energy with which the ions are implanted into the layer of semiconductor material 104'. Generally, ions implanted with less energy will be implanted at relatively shallower depths, while ions implanted with higher energy will be implanted at relatively deeper depths.

Ions may be implanted into the layer of semiconductor material 104' with a predetermined energy selected to implant the ions at a desired depth within the layer of semiconductor material 104'. The ions may be implanted into the layer of semiconductor material 104' before bonding the layer of semiconductor material 104' to the layer of electrically insulating material 105 and the base 106. As one particular non-limiting example, the ion implant plane 112 may be disposed within the layer of semiconductor material 104' at a depth from a surface of the layer of semiconductor material 104', such that the average thickness of the relatively thin layer of semiconductor material 104 is in a range extending from about one thousand nanometers (1,000 nm) to about one hundred nanometers (100 nm). As known in the art, inevitably at least some ions may be implanted at depths other than the desired implantation depth, and a graph of the concentration of the ions as a function of depth into the layer of semiconductor material 104' from the surface of the layer of semiconductor material 104' (e.g., prior to bonding) may exhibit a generally bell-shaped (symmetric or asymmetric) curve having a maximum at the desired implantation depth.

After implanting ions into the layer of semiconductor material 104', the ions may define an ion implant plane 112 (illustrated as a dashed line in FIG. 2) within the layer of semiconductor material 104'. The ion implant plane 112 may comprise a layer or region within the layer of semiconductor material 104' that is aligned with (e.g., centered about) the plane of maximum ion concentration within the layer of semiconductor material 104'. The ion implant plane 112 may define a zone of weakness within the layer of semiconductor material 104' along which the layer of semiconductor material 104' may be cleaved or fractured in a subsequent process. For example, the layer of semiconductor material 104' may be heated to cause the layer of semiconductor material 104' to cleave or fracture along the ion implant plane 112. In some embodiments, during this cleaving process, the temperature of the layer of semiconductor material 104' may be maintained at about 400° C. or less, or even at about 350° C. or less. In other embodiments, however, the cleaving process may be performed at higher temperatures. Optionally, mechanically forces may be applied to the layer of semiconductor material 104' to cause or assist in the cleaving of the layer of semiconductor material 104' along the ion implant plane 112.

In additional embodiments, the relatively thin layer of semiconductor material 104 may be provided over the layer of electrically insulating material 105 and the base 106 by bonding the relatively thick layer of semiconductor material 104' (e.g., a layer having an average thickness of greater than about 100 microns) to the layer of electrically insulating material 105 and the base 106, and subsequently thinning the relatively thick layer of semiconductor material 104' from the side thereof opposite the base 106. For example, the relatively thick layer of semiconductor material 104' may be thinned by removing material from an exposed major surface of the relatively thick layer of semiconductor material 104'. For example, material may be removed from the exposed major surface of the relatively thick layer of semiconductor material 104' using a chemical process (e.g., a wet or dry chemical etching process), a mechanical process (e.g., a grinding or lapping process), or by a chemical-mechanical polishing (CMP) process. In some embodiments, such processes may be carried out at a temperature or temperatures of about 400° C. or less, or even about 350° C. or less. In other embodiments, however, such processes may be carried out at higher temperatures.

In yet further embodiments, the relatively thin layer of semiconductor material 104 may be formed in situ over (e.g., on) the surface 107 of the layer of electrically insulating material 105. For example, the substrate 100 of FIG. 1 may be formed by depositing semiconductor material, such as silicon, polysilicon, or amorphous silicon, on the surface 107 of the layer of electrically insulating material 105 to a desirable thickness. In some embodiments, the deposition process may be performed at a temperature or temperatures of about 400° C. or less, or even about 350° C. or less. For example, a low temperature deposition process for forming the relatively thin layer of semiconductor material 104 may be performed by utilizing a plasma enhanced chemical vapor deposition process, as known in the art. In other embodiments, however, the deposition process may be carried out at higher temperatures.

Figure 3:
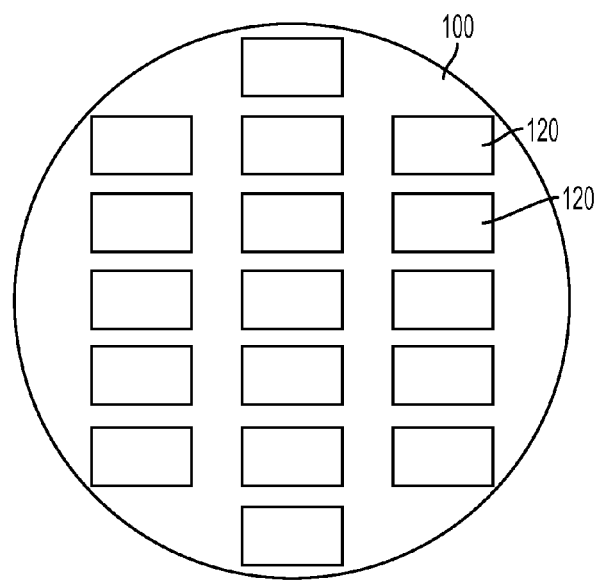
FIG. 3 is a simplified plan view of the SeOI substrate of FIG. 1 schematically illustrating a plurality of processed semiconductor structures thereon.

In some embodiments, the substrate 100 of FIG. 1 may comprise a relatively small die level structure. In other embodiments, the substrate 100 may comprise a relatively larger wafer having an average diameter of about 100 millimeters or more, about 300 millimeters or more, or even about 400 millimeters or more. In such embodiments, a plurality of processed semiconductor structures 120 may be fabricated in and on different areas of the substrate 100, as shown in the simplified schematic illustration of FIG. 3. The plurality of processed semiconductor structures 120 may be arranged in an ordered array or grid pattern on the substrate 100.

Examples of methods that may be used to fabricate the processed semiconductor structures 120 using the substrate 100 are described below with reference to FIGS. 4 and 5, and FIGS. 6A through 6F.

Figure 4:
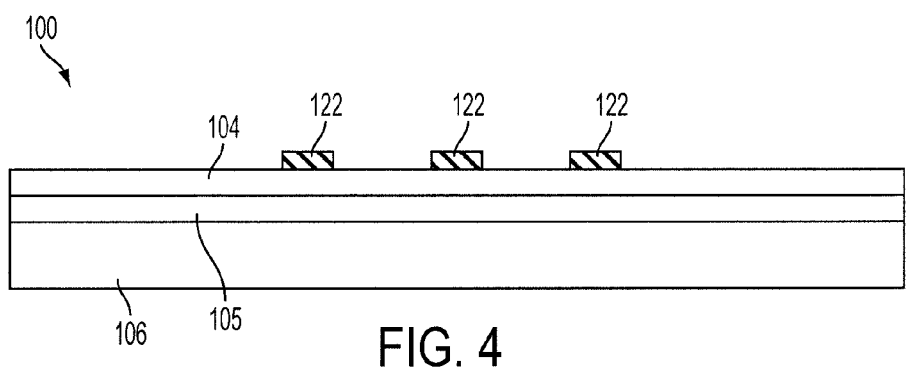
FIG. 4 is a simplified cross-sectional view schematically illustrating a plurality of transistors formed in and over a layer of semiconductor material of the SeOI substrate of FIG. 1.

Referring to FIG. 4, a plurality of transistors 122 may be formed in and on selected areas of the layer of semiconductor material 104 corresponding to the areas at which processed semiconductor structures 120 (FIG. 3) are to be faulted. The transistors 122 are illustrated schematically in FIG. 4. As known in the art, each of the transistors 122 may comprise a source region and a drain region, separated by a channel region. These source, drain, and channel regions may be formed in the layer of semiconductor material 104. A gate structure may be formed over the layer of semiconductor material 104 vertically above the channel region between the source region and the drain region. Although only three transistors 122 are shown in FIG. 4 for simplicity, in actuality, each processed semiconductor structure 122 may comprise thousands, millions, or even more transistors 122.

Figure 5:
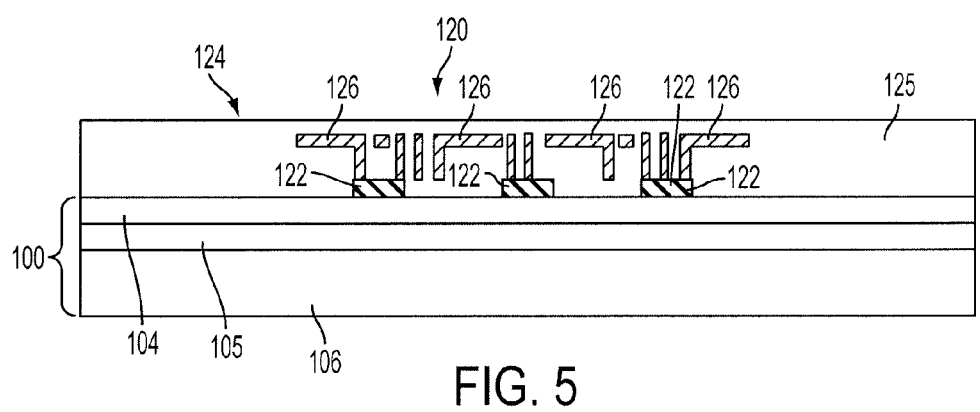
FIG. 5 is a simplified cross-sectional view illustrating a first metallization layer formed over the transistors and the first side of the layer of semiconductor material of the SeOI substrate of FIG. 1.

Referring to FIG. 5, a first metallization layer 124 may be formed over a first side of the layer of semiconductor material 104 opposite the layer of electrically insulating material 105. The first metallization layer 124 includes a plurality of electrically conductive features 126. The plurality of electrically conductive features 126 may comprise one or more of vertically extending conductive vias, laterally extending conductive traces, and conductive contact pads. At least some of the conductive features 126 may be in electrical contact with corresponding features of the transistors 122, such as source regions, drain regions, and gate structures of the transistors 122. The conductive features 126 may be formed from and comprise a metal. The first metallization layer 124 may be formed in a layer-by-layer process, in which alternating layers of metal and dielectric material 125 are deposited and patterned in such a manner as to form the conductive features 126, which may be embedded within and surrounded by a dielectric material 125. The conductive features 126 may be used to route or redistribute electrical pathways from the locations of the various active components of the transistors 122 to other locations remote therefrom. Thus, in some embodiments, the first metallization layer 124 may comprise what is referred to in the art as a redistribution layer (RDL).

In the embodiment of FIG. 5, the conductive features 126 are formed in the first metallization layer 124 over areas of the substrate 100 on which transistors 122 have been formed, commonly referred to as active regions, but not over other areas of the substrate 100 that do not include any transistors 122, commonly referred to as non-active regions.

Figure 6A:
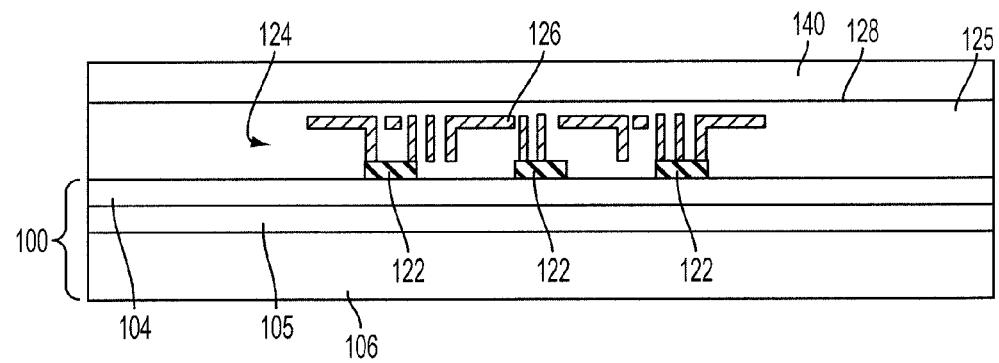
FIGS. 6A through 6F are used to illustrate embodiments of methods of the disclosure that may be used to form a structure that includes two or more processed semiconductor structures carried by the structure of FIG. 5, and to electrically interconnect at least two of the processed semiconductor structures.
Figure 6B:
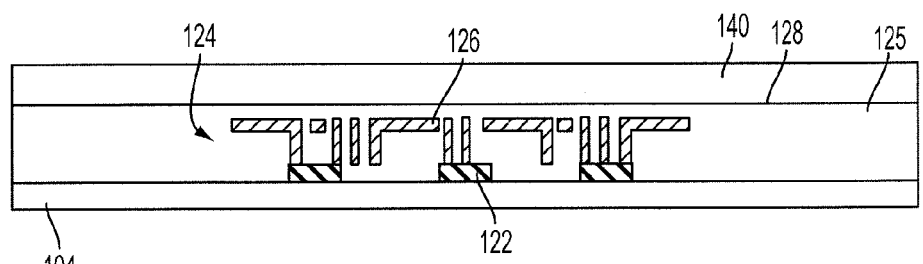
Figure 6C:
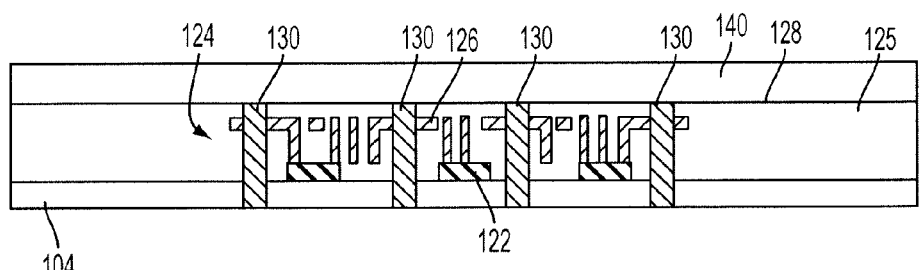
Figure 6D:
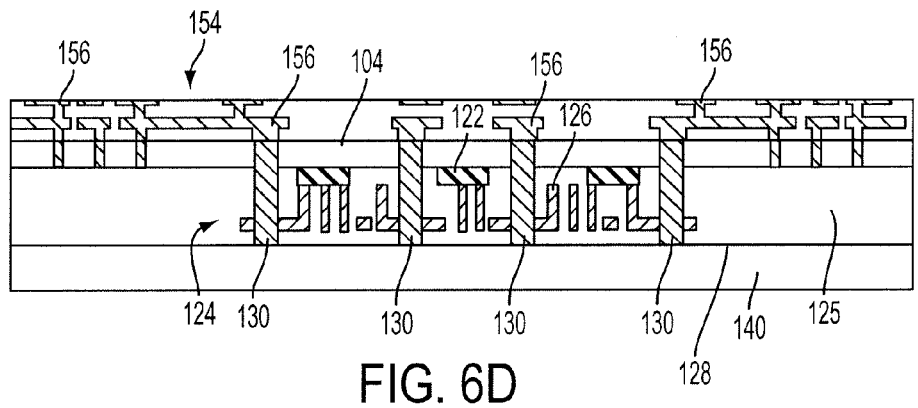
Figure 6E:
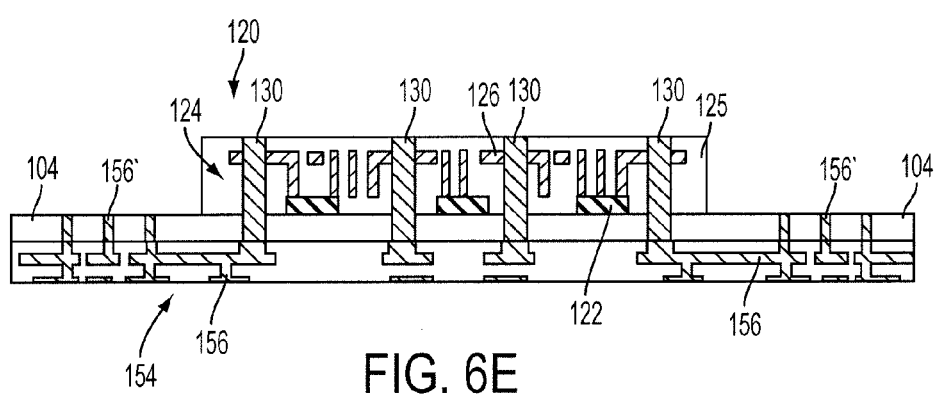
Figure 6F:
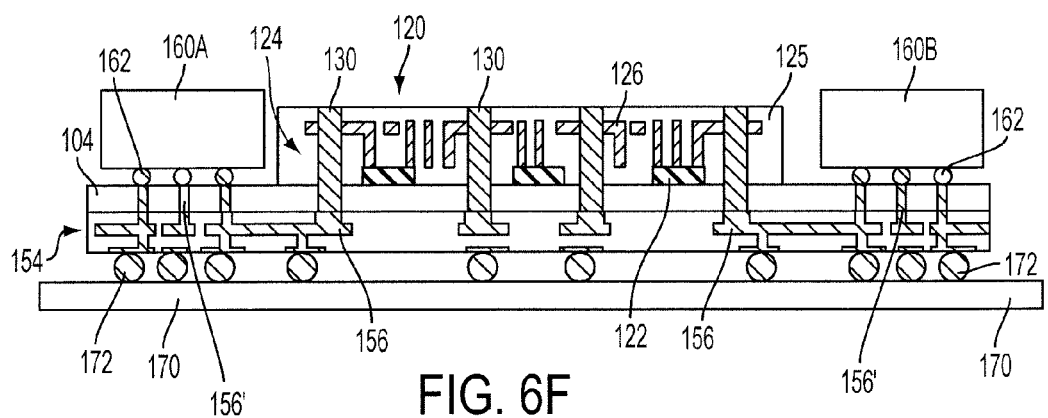

FIGS. 6A through 6F illustrate the fabrication of a bonded semiconductor structure shown in FIG. 6F, which includes two or more processed semiconductor structures (e.g., semiconductor devices) carried by a portion of the substrate 100. Further, the portion of the substrate 100 is used to provide a direct, continuous electrical pathway between two or more of the processed semiconductor structures through the portion of the SeOI substrate 100.

Methods of the embodiments of the disclosure may utilize the processed semiconductor structure 120 of FIG. 5.

Next, referring to FIG. 6A, a carrier substrate 140 optionally may be temporarily bonded to an exposed major surface 128 of the first metallization layer 124 of the processed semiconductor structure 120 of FIG. 5. The carrier substrate 140 may be used to facilitate handling of the semiconductor structure by processing equipment during subsequent manufacturing processes.

After bonding the carrier substrate 140 to the first metallization layer 124, the base 106 and the layer of electrically insulating material 105 of the substrate 100 may be removed to form the structure shown in FIG. 6B. The base 106 and the layer of electrically insulating material 105 of the substrate 100 may be removed using, for example, a chemical process (e.g., a wet or dry chemical etching process), a mechanical process (e.g., a grinding or lapping process), or by a chemical-mechanical polishing (CMP) process.

After removing the base 106 and the layer of electrically insulating material 105, a plurality of through wafer interconnects 130 may be formed at least partially through the layer of semiconductor material 104, at least partially through dielectric material 125 and in the active device area to form the structure as shown in FIG. 6C. The through wafer interconnects 130 may be formed by etching holes or vias through the layer of semiconductor material 104, at least partially through dielectric material 125 and in the active device area, and by subsequently filling the holes or vias with one or more electrically conductive materials (e.g., copper or a copper alloy), or by any other method known in the art. For example, one or more of the through wafer interconnects 130 may be formed to extend entirely through each of the first metallization layer 124 and the layer of semiconductor material 104 to the carrier substrate 140. The carrier substrate 140 may be used as an etch-stop layer in an etching process used to form the holes or vias that are ultimately filled with one or more electrically conductive materials to form the through wafer interconnects 130. It should be noted that the electrically conductive features 126 may also act as etch-stop layers in an etching process used to form the holes or vias in some embodiments of the disclosure.

At least some of the through wafer interconnects 130 may contact conductive features 126 of the first metallization layer 124, and, hence, be in electrical contact with one or more active device features of the transistors 122.

By way of example and not limitation, one or more masking and etching processes may be used to form the holes or vias, and one or more of an electroless plating process and an electrolytic plating process may be used to fill the holes or vias with the conductive material. In some embodiments, each of the processes used to form the through wafer interconnects 130, including formation of the holes or vias, and filling of the holes or vias with electrically conductive material, may be carried out at a temperature or temperatures of about 400° C. or less, or even about 350° C. or less. In other embodiments, however, such processes may be carried out at higher temperatures. For example, in embodiments where copper may be utilized in the back-end of line (BEOL) processes used to form the through wafer interconnects, the temperature may not exceed greater than approximately 400° C., alternatively in embodiments where aluminum may be utilized in the BEOL processes used to form the through wafer interconnects, the temperature may exceed greater than approximately 400° C.

Referring to FIG. 6D, after removing the base 106 and the layer of electrically insulating material 105, and defining the holes or vias, a second metallization layer 154 may be formed over a second side of the layer of semiconductor material 104 opposite from the first side of the layer of semiconductor material 104 on which the first metallization layer 124 has been formed. The perspective of FIG. 6D is inverted relative to the perspective of FIGS. 6A through 6C, as the structure would likely be inverted to facilitate formation of the second metallization layer 154 on the opposite, second side of the layer of semiconductor material 104.

The second metallization layer 154 is similar to the first metallization layer 124, and includes a plurality of electrically conductive features 156. The plurality of electrically conductive features 156 may comprise one or more of vertically extending conductive vias, laterally extending conductive traces, and conductive contact pads. At least some of the conductive features 156 may be in electrical contact with the through wafer interconnects 130, and, hence, also may be in electrical contact with conductive features 126 of the first metallization layer 124 and active regions of the transistors 122, such as source regions, drain regions, and gate structures. The conductive features 156 may be formed from and comprise a metal. The second metallization layer 154, like the first metallization layer 124, may be formed in a layer-by-layer process, for example, via the commonly known damascene process, in which alternating layers of metal and dielectric material are deposited and patterned in such a manner as to form the conductive features 156, which may be embedded within and surrounded by a dielectric material. The conductive features 156 may be used to route or redistribute electrical pathways from the locations at which the through wafer interconnects 130 are exposed through the second side of the layer of semiconductor material 104 to other locations remote therefrom. Thus, in some embodiments, the second metallization layer 154 may comprise what is referred to in the art as a redistribution layer (RDL).

Additionally, as shown in FIG. 6D, some of the conductive features 156 of the second metallization layer 154 may provide a direct, continuous electrical connection through the second metallization layer 154 between the ends of two or more through wafer interconnects 130 exposed on the second side of the layer of semiconductor material 104.

FIG. 6E shows the semiconductor structure once again inverted, such that the second metallization layer 154 is on the bottom of the semiconductor structure from the perspective of FIG. 6D. After formation of the conductive features 156 of the second metallization layer 154, the dielectric material 125 in portions of the first metallization layer 124 may be removed. Areas of the first metallization layer 124 to be removed may comprise dielectric material 125 in the non-active areas, i.e., the dielectric material 125 in regions where there are no active devices. The dielectric material 125 may be removed, for example, via an etching process, such as a dry etch (e.g. reactive ion etching) or a wet etch. In order to remove the dielectric material 125 in non-active regions of the processed semiconductor structure 120, the processed structure as illustrated FIG. 6D may be detached from the carrier substrate 140 and attached to an additional carrier (not shown). The additional carrier may be attached to the second metallization layer 154. Upon removal of the dielectric material 125 from the non-active regions of the processed semiconductor structure 120, the vias 156' of the second metallization 154 become exposed, as illustrated in FIG. 6E.

After removing portions of dielectric material 125 and exposing vias 156', the processed semiconductor structure 120 of FIG. 6E can be diced. In addition, the die can be electrically tested and known good die (KGD) mounted on a package utilizing bump technology. Subsequently, additional die (utilizing similar or different functionality or fabricated using similar or different technology) may be stacked on top of the interposer of FIG. 6E, above the active devices, i.e., in active regions and above non-active devices, i.e., non-active areas, using micro-bump technology.

It should be noted that a silicon-on-insulator (SOI) interposer as utilized in embodiments of the disclosure, assists in providing the fan-out (or redistribution) layers that are commonly needed to match the electrical routing between the interposer and device package in a cost effective manner. Alternatively, the common practice of shrinking the package routing to match the device routing adds significant cost to the device package. In addition, the SOI interposer provides non-active areas that may have further die (or further stacks of die) from similar or different technologies stacked and connected to the package through the same electrical routing.

Therefore, in greater detail, at this stage in the processing, one or more processed semiconductor structures 120 may have been formed in situ on and in the layer of semiconductor material 104 of the substrate 100 (i.e., the remaining portion of the substrate 100), as illustrated in FIG. 6E. Such processed semiconductor structures 120 are carried by the layer of semiconductor material 104. The one or more processed semiconductor structures 120 may comprise, for example, electronic signal processors, electronic memory devices, and/or optoelectronic devices (e.g., light-emitting diodes, laser-emitting diodes, solar cells, etc.).

Referring to FIG. 6F, one or more additional processed semiconductor structures, such as processed semiconductor structure 160A and processed semiconductor structure 160B, may be structurally and electrically coupled to the exposed ends of through wafer interconnects 130 and vias 156' on the first side of the layer of semiconductor material 104 to form the bonded semiconductor structure shown in FIG. 6F. The additional processed semiconductor structures 160A, 160B may be carried by the layer of semiconductor material 104 on a common side thereof with the processed semiconductor structure 120 formed in situ in and on the layer of semiconductor material 104.

Each of the additional processed semiconductor structures 160A, 160B may comprise a semiconductor device such as an electronic signal processor, an electronic memory device, and/or an optoelectronic devices (e.g., a light-emitting diode, a laser-emitting diode, a solar cell, etc.). As one non-limiting example, the processed semiconductor structure 120 formed in situ may comprise an electronic signal processor device, and each of the additional processed semiconductor structures 160A, 160B may comprise at least one of an electronic memory device, a light-emitting diode, a laser-emitting diode, and a solar cell.

In some embodiments, conductive features of the additional processed semiconductor structures 160A, 160B, such as conductive pads, may be structurally and electrically coupled to respective through wafer interconnects 130 and vias 156' using, for example, conductive solder micro-bumps or balls 162, as known in the art. In addition, the additional processed semiconductor structures 160A and 160B may include interposers and electrical routing structures as fabricated by the methods of the disclosure previously described.

By electrically coupling the additional processed semiconductor structures 160A, 160B to the through wafer interconnects 130 and vias 156', one or more electrical pathways may be provided that extend continuously through the first metallization layer 124, the remaining portion of the substrate 100 (i.e., through the layer of semiconductor material 104 via the through wafer interconnects 130 and vias 156'), and the second metallization layer 154 between the processed semiconductor structure 120 and each of the additional processed semiconductor structures 160A, 160B. Such electrical pathways may be used to convey electronic signals and/or electrical power between the processed semiconductor structures 120, 160A, 160B. Thus, the processed semiconductor structures 120, 160A, 160B may be designed and configured to operate together as a single semiconductor package device.

As also shown in FIG. 6F, conductive features 156 of the second metallization layer 154 may be structurally and electrically coupled to conductive features of another higher level structure, such as another substrate 170. The substrate 170 may comprise an organic printed circuit board, for example, and may comprise a package level substrate. The conductive features 156 of the second metallization layer 154 may be structurally and electrically coupled to conductive features of the substrate 170 using, for example, conductive solder bumps or balls 172, as known in the art. Electrical pathways may also be provided between the processed semiconductor structures 120, 160A, 160B, through the first metallization layer 124, the through wafer interconnects 130, and the second metallization layer 154 to conductive features of the additional substrate 170, and such additional electrical pathways also may be used for conveying electrical power and/or electrical signals therebetween.

FIGS. 7A through 7F are similar to FIGS. 6A through 6F and are used to illustrate additional embodiments of methods of the disclosure that may be used to form a bonded semiconductor structure that includes two or more processed semiconductor structures carried by the structure of FIG. 5. In the embodiments of FIGS. 7A through 7F, however, the layer of electrically insulating material 105 of the substrate 100 is not removed during processing, as in the embodiments of FIGS. 6A through 6F. The processes of the methods of FIGS. 7A through 7F are generally the same as those described above in relation to FIGS. 6A though 6F, and details previously described are not repeated below.

Figure 7A:
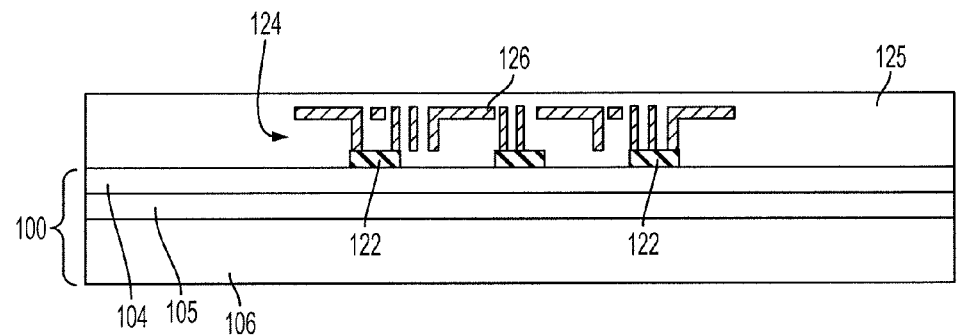
FIGS. 7A through 7F are similar to FIGS. 6A through 6F and are used to illustrate additional embodiments of methods of the disclosure that may be used to form a structure that includes two or more processed semiconductor structures carried by the structure of FIG. 5, and to electrically interconnect at least two of the processed semiconductor structures, wherein a layer of electrically insulating material of the SeOI substrate is not removed during processing.

Methods of additional embodiments of the disclosure may again utilize a processed semiconductor structure 120 as illustrated in FIG. 7A.

Figure 7B:
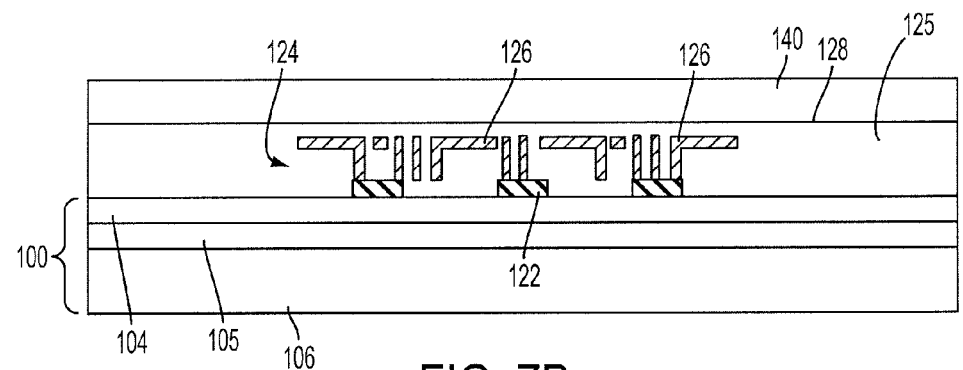
Figure 7C:
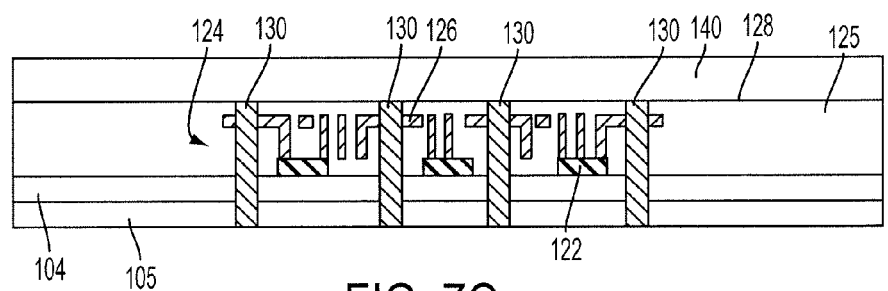

As shown in FIG. 7B, a carrier substrate 140 optionally may be temporarily bonded to an exposed major surface 128 of the first metallization layer 124. After bonding the carrier substrate 140 to the first metallization layer 124, the base 106 of the substrate 100 may be removed from the structure, leaving behind the layer of semiconductor material 104 and the layer of electrically insulating material 105. A plurality of through wafer interconnects 130 may be formed through the first metallization layer 124, through the layer of semiconductor material 104, and also through the layer of electrically insulating material 105 to form the structure shown in FIG. 7C. In such methods, the carrier substrate 140 may be used as an etch-stop layer in an etching process used to form the holes or vias that are ultimately filled with one or more electrically conductive materials to form the through wafer interconnects 130.

Figure 7D:
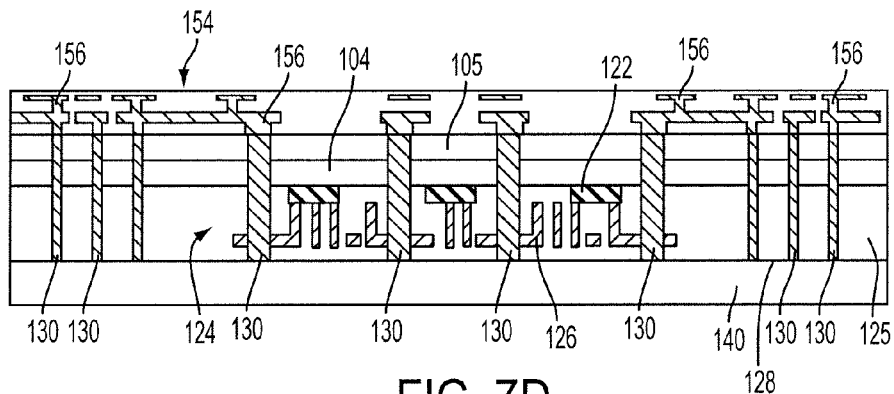

Referring to FIG. 7D, a second metallization layer 154 may be formed over a second side of the layer of semiconductor material 104 opposite from the first side of the layer of semiconductor material 104 on which the first metallization layer 124 has been formed. In other words, the second metallization layer 154 may be formed over the layer of electrically insulating material 105. The perspective of FIG. 7D is inverted relative to the perspective of FIGS. 7A through 7C, as the structure would likely be inverted to facilitate formation of the second metallization layer 154. The second metallization layer 154 is similar to the first metallization layer 124, and includes a plurality of electrically conductive features 156, as described herein.

Figure 7E:
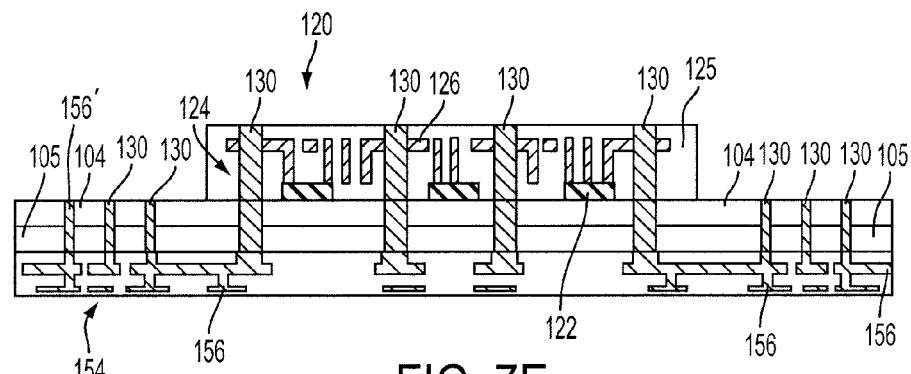

FIG. 7E shows the semiconductor structure once again inverted, such that the second metallization layer 154 is on the bottom of the semiconductor structure from the perspective of FIG. 7E. As shown in FIG. 7E, portions of the first metallization layer 124 and the carrier substrate 140 may be removed. For example, regions of the first metallization layer 124 overlying areas of the layer of semiconductor material 104 that do not include any transistors 122 may be removed, i.e., removal of dielectric material 125 from non-active regions of the processed semiconductor structure. The dielectric material 125 may be removed, for example, via an etching process, such as a dry etch (e.g. reactive ion etching) or a wet etch. In order to remove the dielectric material 125 in non-active regions of the processed semiconductor structure 120, the processed structure as illustrated FIG. 7D may be detached from the carrier substrate 140 and attached to an additional carrier (not shown). The additional carrier may be attached to the second metallization layer 154. Upon removal of the dielectric material 125 from the non-active regions of the processed semiconductor structure the vias 156' of the second metallization 154 become exposed, as illustrated in FIG. 7E.

At this stage in processing, one or more processed semiconductor structures 120 may have been formed in situ on and in the layer of semiconductor material 104 of the remaining portion of the substrate 100. The processed semiconductor structure of FIG. 7E can be diced (and the carrier removed). In addition, the die can be electrically tested and known good die (KGD) mounted on a package utilizing bump technology. Subsequently, additional die (utilizing similar or different functionality or fabricated using similar or different technology) may be stacked on top of the interposer of FIG. 7E, above the active devices, i.e., in active regions and above non-active device, i.e., non-active areas, using micro-bump technology.

Figure 7F:
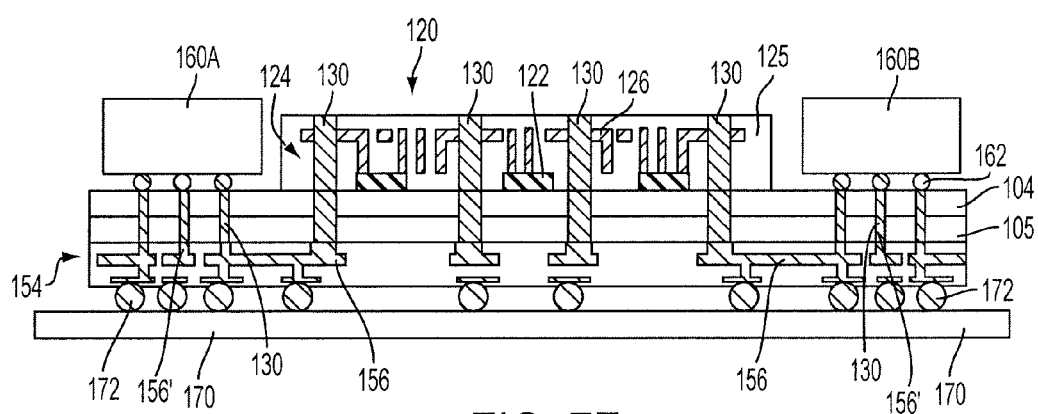

Referring to FIG. 7F, one or more additional processed semiconductor structures, such as the processed semiconductor structure 160A and the processed semiconductor structure 160B, may be structurally and electrically coupled to the exposed ends of through wafer interconnects 130 and vias 156' on the first side of the layer of semiconductor material 104 to form the bonded semiconductor structure shown in FIG. 7F.

By electrically coupling the additional processed semiconductor structures 160A, 160B to the through wafer interconnects 130 and vias 156', one or more electrical pathways may be provided that extend continuously through the first metallization layer 124, the remaining portion of the substrate 100 (i.e., through the layer of semiconductor material 104 and the layer of electrically insulating material 105 via the through wafer interconnects 130 and vias 156'), and the second metallization layer 154 between the processed semiconductor structure 120 and each of the additional processed semiconductor structures 160A, 160B. Such electrical pathways may be used to convey electronic signals and/or electrical power between the processed semiconductor structures 120, 160A, 160B.

As also shown in FIG. 7F, conductive features 156 of the second metallization layer 154 may be structurally and electrically coupled to conductive features of another higher level structure, such as another substrate 170. Electrical pathways may also be provided between the processed semiconductor structures 120, 160A, 160B through the first metallization layer 124, the through wafer interconnects 130, and the second metallization layer 154 to conductive features of the additional substrate 170, and such additional electrical pathways also may be used for conveying electrical power and/or electrical signals therebetween.

In yet further embodiments of methods of the disclosure, the first metallization layer 124 may include additional conductive features 126 in regions that do not correspond to regions at which processed semiconductor structures are to be formed in situ, and such regions of the first metallization layer may not be removed during processing.

Figure 8:
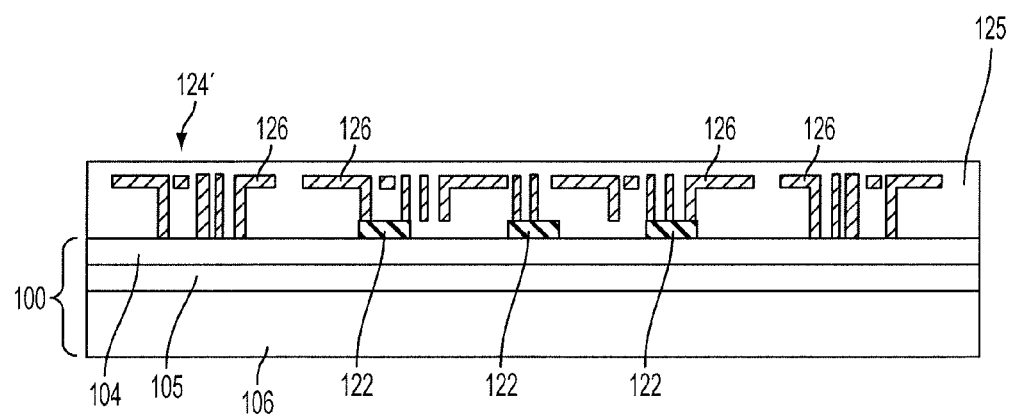
FIG. 8 is similar to FIG. 5, and illustrates a first metallization layer formed over the transistors and the first side of the layer of semiconductor material of the SeOI substrate of FIG. 1, including over areas of the SeOI substrate on which transistors have not been formed.

For example, FIG. 8 is similar to FIG. 5 and illustrates a first metallization layer 124' that may be formed over a first side of the layer of semiconductor material 104 opposite the layer of electrically insulating material 105. In the embodiment of FIG. 8, conductive features 126 are formed in the first metallization layer 124 over areas of the substrate 100 on which transistors 122 have been foiined, and additional conductive features 126 are formed over other areas of the substrate 100 that do not include any transistors 122.

FIGS. 9A through 9F illustrate methods of forming a bonded semiconductor like those previously described with reference to FIGS. 6A through 6F, but utilizing the structure shown in FIG. 8, which includes the first metallization layer 124', instead of the structure shown in FIG. 5. The processes of the methods of FIGS. 9A through 9F are generally similar to those described above in relation to FIGS. 6A though 6F, and details previously described are not repeated below.

Figure 9A:
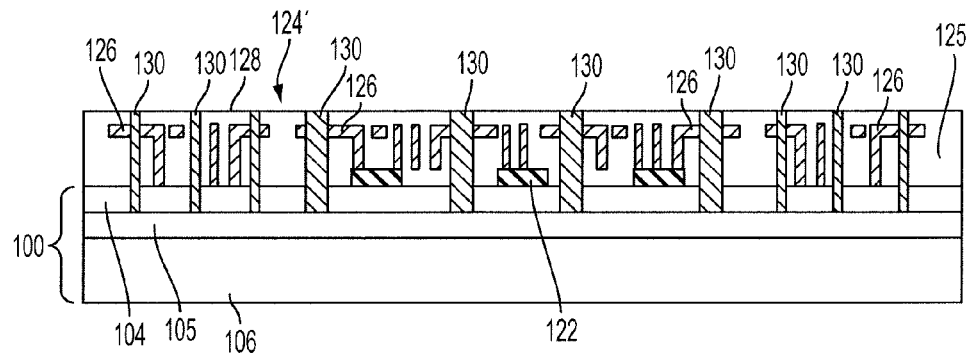
FIGS. 9A through 9F are similar to FIGS. 6A through 6F and are used to illustrate additional embodiments of methods of the disclosure that may be used to form a structure that includes two or more processed semiconductor structures carried by the structure of FIG. 8, and to electrically interconnect at least two of the processed semiconductor structures, wherein a layer of electrically insulating material of the SeOI substrate is removed during processing.

Referring to FIG. 9A, a plurality of through wafer interconnects 130 may be formed through each of the first metallization layer 124' and the layer of semiconductor material 104 to the layer of electrically insulating material 105. In such methods, the layer of electrically insulating material 105 may be used as an etch-stop layer in an etching process used to form the holes or vias that are ultimately filled with one or more electrically conductive materials to form the through wafer interconnects 130.

Figure 9B:
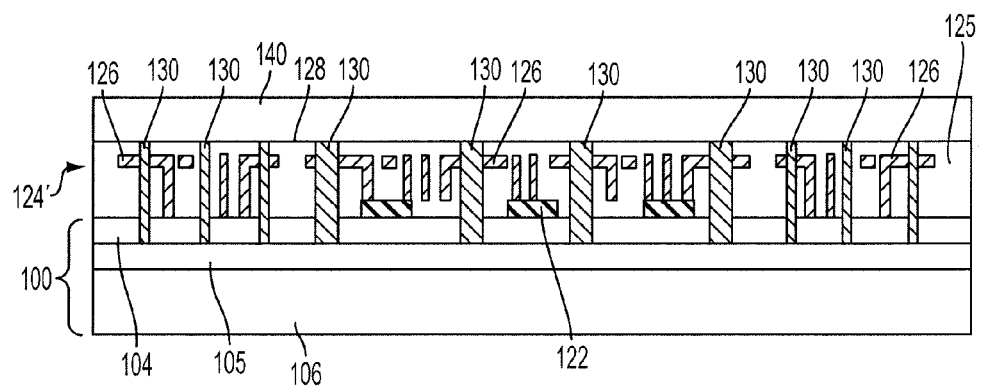

As shown in FIG. 9B, a carrier substrate 140 optionally may be temporarily bonded to an exposed major surface 128 of the first metallization layer 124' after forming the through wafer interconnects 130 through the first metallization layer 124' and the layer of semiconductor material 104. After bonding the carrier substrate 140 to the first metallization layer 124', the base 106 and the layer of electrically insulating material 105 of the substrate 100 may be removed from the structure, leaving behind the layer of semiconductor material 104 to form the structure shown in FIG. 9C.

Figure 9C:
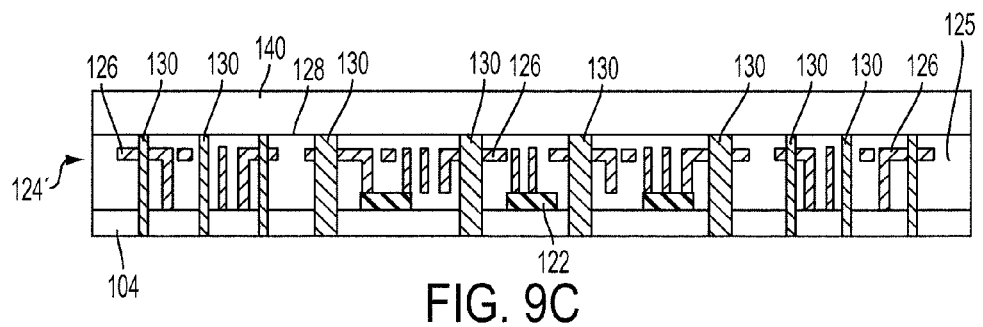

It should be noted that the semiconductor structure as illustrated on FIG. 9C may also alternatively be fabricated by mounting the semiconductor structure of FIG. 8 on a carrier substrate, and removing the semiconductor material 104 and the layer of electrically insulating material 105 through one or more of grinding and polishing. Subsequent processes define the through wafer interconnections 130 through semiconductor layer 104 and into the first metallization layer 124'.

Figure 9D:
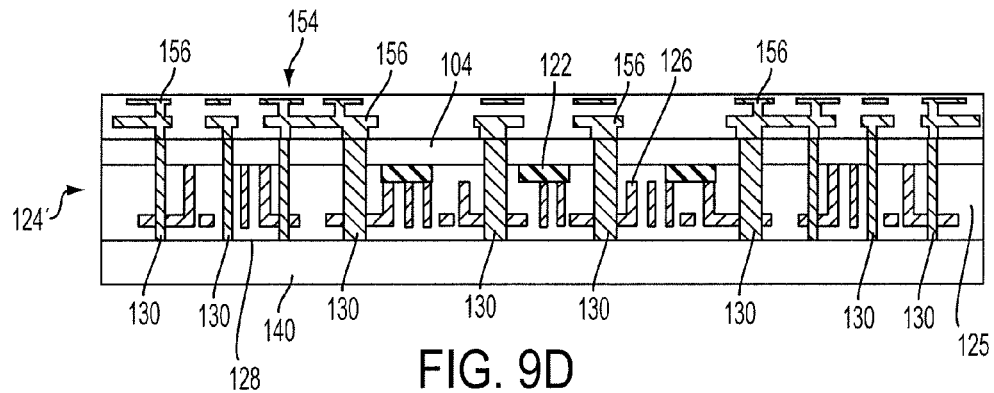

Referring to FIG. 9D, a second metallization layer 154 may be formed over a second side of the layer of semiconductor material 104 opposite from the first side of the layer of semiconductor material 104 on which the first metallization layer 124' has been formed. The perspective of FIG. 9D is inverted relative to the perspective of FIGS. 9A through 9C, as the structure would likely be inverted to facilitate formation of the second metallization layer 154. The second metallization layer 154 is similar to the first metallization layer 124', and includes a plurality of electrically conductive features 156, as previously described herein.

Figure 9E:
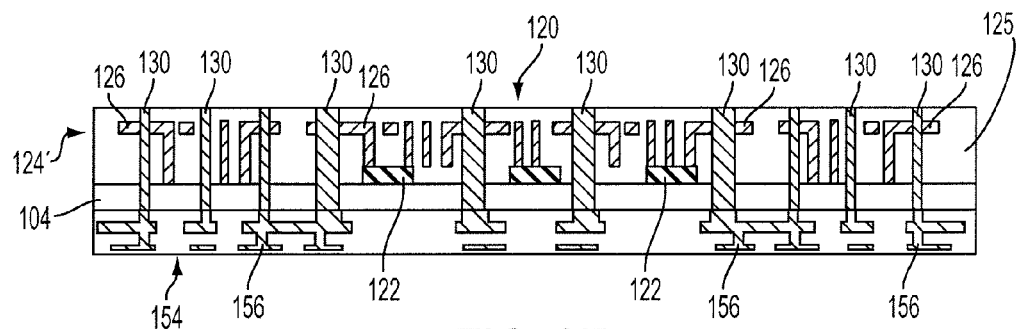

FIG. 9E shows the semiconductor structure once again inverted, such that the second metallization layer 154 is on the bottom of the semiconductor structure from the perspective of FIG. 9E. As shown in FIG. 9E, the carrier substrate 140 may be removed. Regions of the first metallization layer 124' overlying areas of the layer of semiconductor material 104 that do not include any transistors 122, however, may not be removed as in previously described embodiments.

At this stage in processing, one or more processed semiconductor structures 120 may have been formed in situ on and in the layer of semiconductor material 104 of the remaining portion of the substrate 100.

At this stage of the processing, the processed semiconductor structure of FIG. 9E can be diced (and the carrier removed). In addition, the die can be electrically tested and known good die (KGD) mounted on a package utilizing bump technology. Subsequently, additional die (utilizing similar or different functionality or fabricated using similar or different technology) may be stacked on top of the interposer of FIG. 9E, above the active devices, i.e., in active regions and above non-active devices, i.e., non-active areas, using micro-bump technology.

Figure 9F:
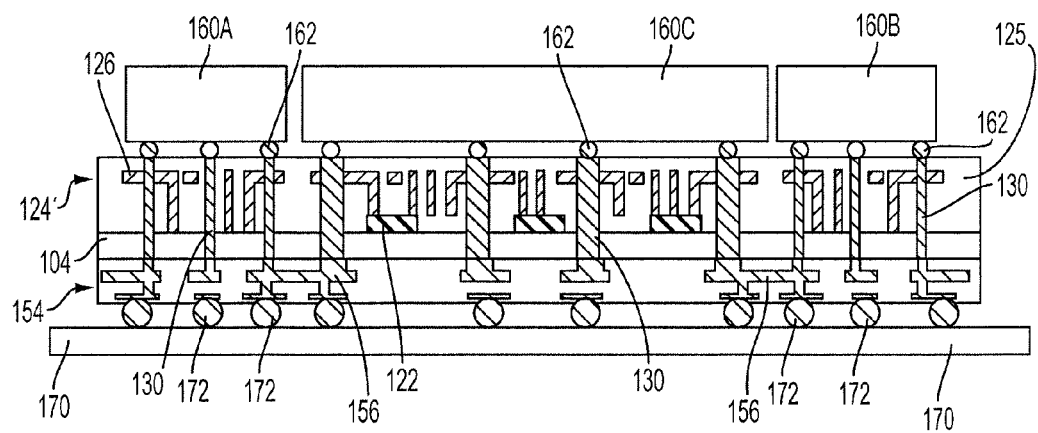

Therefore, in greater detail, referring to FIG. 9F, one or more additional processed semiconductor structures, such as the processed semiconductor structure 160A, the processed semiconductor structure 160B, and a processed semiconductor structure 160C may be structurally and electrically coupled to the exposed ends of through wafer interconnects 130 at the exposed major surface of the first metallization layer 124' to form the bonded semiconductor structure shown in FIG. 9F. The additional processed semiconductor structure 160C may comprise any of the types of processed semiconductor structures mentioned previously in relation to the additional processed semiconductor structures 160A and 160B. Thus configured, electrical pathways may be provided between the processed semiconductor structures 120, 160A, 160B, 160C through the first metallization layer 124', the through wafer interconnects 130, and the second metallization layer 154, which electrical pathways may be used for conveying electrical power and/or electrical signals therebetween.

As also shown in FIG. 9F, conductive features 156 of the second metallization layer 154 may be structurally and electrically coupled to conductive features of another higher level structure, such as another substrate 170, as previously described herein. Electrical pathways may also be provided between the processed semiconductor structures 120, 160A, 160B, 160C through the first metallization layer 124', the through wafer interconnects 130, and the second metallization layer 154 to conductive features of the additional substrate 170, and such additional electrical pathways also may be used for conveying electrical power and/or electrical signals therebetween.

FIGS. 10A through 10F illustrate methods of forming a bonded semiconductor like those previously described with reference to FIGS. 7A through 7F, but utilizing the structure shown in FIG. 8, which includes the first metallization layer 124', instead of the structure shown in FIG. 5. The processes of the methods of FIGS. 10A through 10F are generally similar to those described above in relation to FIGS. 6A though 6F and 7A through 7F, and details previously described are not repeated below.

Figure 10A:
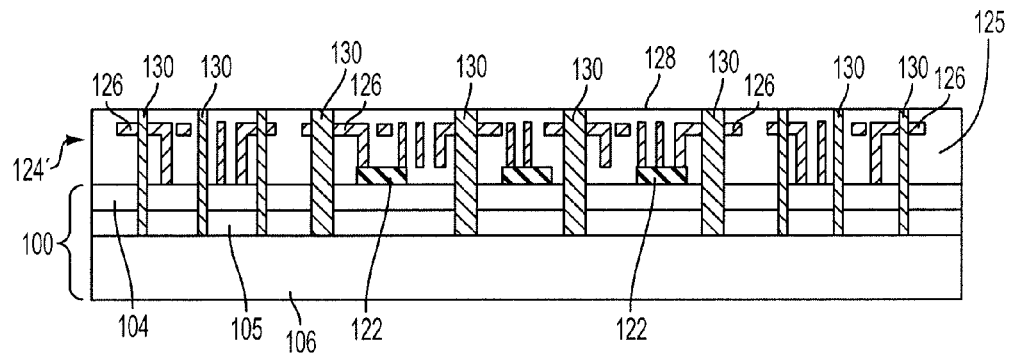
FIGS. 10A through 10F are similar to FIGS. 9A through 9F and are used to illustrate additional embodiments of methods of the disclosure that may be used to form a structure that includes two or more processed semiconductor structures carried by the structure of FIG. 8, and to electrically interconnect at least two of the processed semiconductor structures, wherein a layer of electrically insulating material of the SeOI substrate is not removed during processing.

Referring to FIG. 10A, a plurality of through wafer interconnects 130 may be formed through each of the first metallization layer 124', the layer of semiconductor material 104, and the layer of electrically insulating material 105 to the base 106. In such methods, the base 106 may be used as an etch-stop layer in an etching process used to form the holes or vias that are ultimately filled with one or more electrically conductive materials to form the through wafer interconnects 130.

Figure 10B:
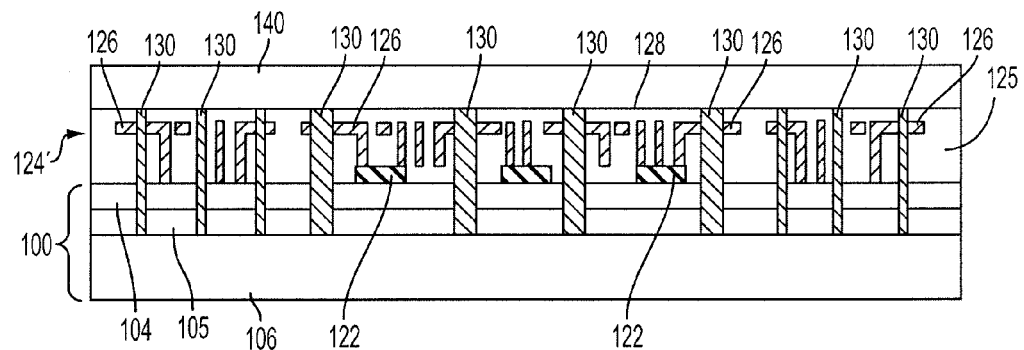

As shown in FIG. 10B, a carrier substrate 140 optionally may be temporarily bonded to an exposed major surface 128 of the first metallization layer 124' after forming the through wafer interconnects 130 through the first metallization layer 124', the layer of semiconductor material 104, and the layer of electrically insulating material 105. After bonding the carrier substrate 140 to the first metallization layer 124', the base 106 of the substrate 100 may be removed from the structure, leaving behind the layer of semiconductor material 104 and the layer of insulating material 105 to form the structure shown in FIG. 10C.

Figure 10C:
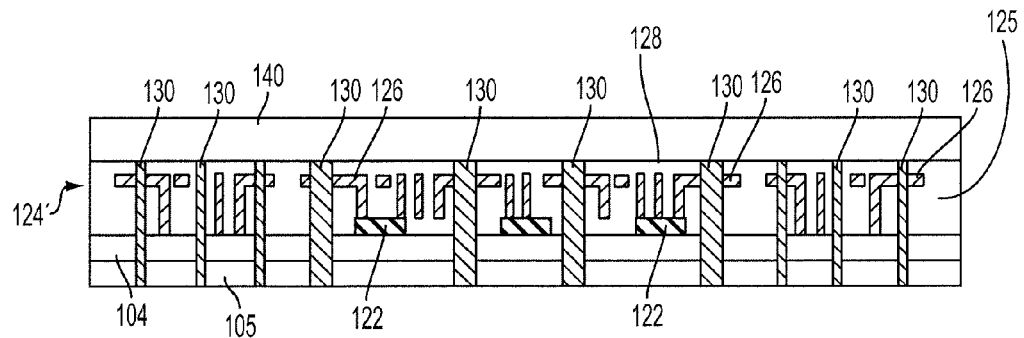

It should be noted that the semiconductor structure as illustrated in FIG. 10C may also alternatively be fabricated by mounting the semiconductor structure of FIG. 8 on a carrier substrate, and removing the semiconductor material 104 through one or more of grinding and polishing. Subsequent processes may define the through wafer interconnections 130 through the layer of insulating material 105, through the semiconductor layer 104 and into the first metallization layer 124'.

Figure 10D:
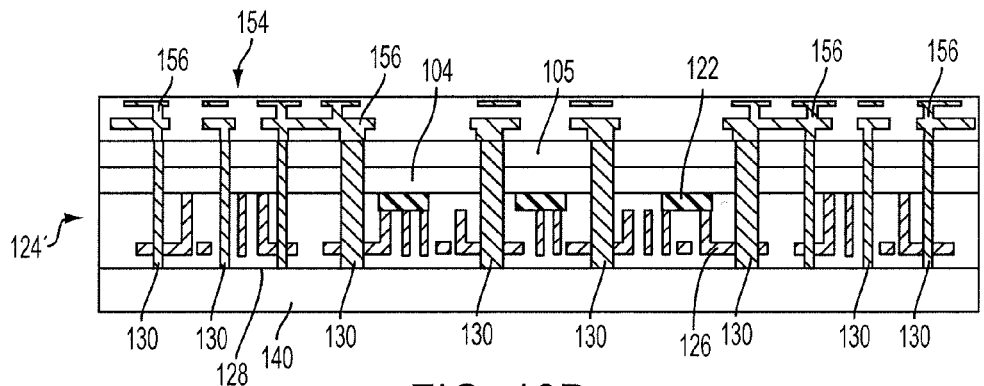

Referring to FIG. 10D, a second metallization layer 154 may be formed over a second side of the layer of semiconductor material 104 opposite from the first side of the layer of semiconductor material 104 on which the first metallization layer 124' has been formed. In other words, the second metallization layer 154 may be faulted over the layer of electrically insulating material 105 on a side thereof opposite the layer of semiconductor material 104. The perspective of FIG. 10D is inverted relative to the perspective of FIGS. 10A through 10C, as the structure would likely be inverted to facilitate formation of the second metallization layer 154. The second metallization layer 154 is similar to the first metallization layer 124', and includes a plurality of electrically conductive features 156, as previously described herein.

Figure 10E:
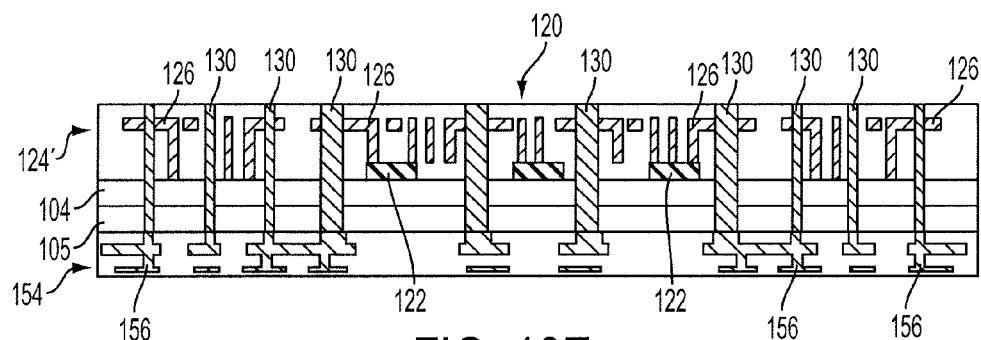

FIG. 10E shows the semiconductor structure once again inverted, such that the second metallization layer 154 is on the bottom of the semiconductor structure from the perspective of FIG. 10E. As shown in FIG. 10E, the carrier substrate 140 may be removed. Regions of the first metallization layer 124' overlying areas of the layer of semiconductor material 104 that do not include any transistors 122, however, may not be removed as in the embodiments previously described with reference to FIGS. 6A through 6F and 7A through 7F. At this stage in processing, one or more processed semiconductor structures 120 may have been formed in situ on and in the layer of semiconductor material 104 of the remaining portion of the substrate 100.

At this stage of the processing, the processed semiconductor structure of FIG. 10E can be diced. In addition, the die can be electrically tested and known good die (KGD) mounted on a package utilizing bump technology. Subsequently, additional die (utilizing similar or different functionality or fabricated using similar or different technology) may be stacked on top of the interposer of FIG. 10E, above the active devices, i.e., in active regions and above non-active devices, i.e., non-active areas, using micro-bump technology.

Figure 10F:
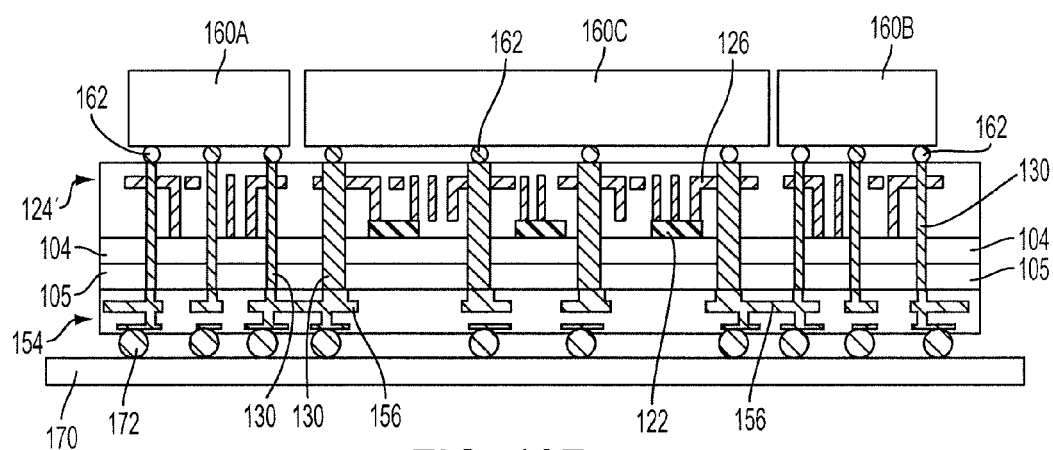

Therefore, in greater detail, referring to FIG. 10F, one or more additional processed semiconductor structures, such as the processed semiconductor structure 160A, the processed semiconductor structure 160B, and the processed semiconductor structure 160C may be structurally and electrically coupled to the exposed ends of through wafer interconnects 130 at the exposed major surface of the first metallization layer 124' to form the bonded semiconductor structure shown in FIG. 10F. Thus, electrical pathways may be provided between the processed semiconductor structures 120, 160A, 160B, 160C through the first metallization layer 124', the through wafer interconnects 130, and the second metallization layer 154, which electrical pathways may be used for conveying electrical power and/or electrical signals therebetween.

As also shown in FIG. 10F, conductive features 156 of the second metallization layer 154 may be structurally and electrically coupled to conductive features of another higher level structure, such as another substrate 170, as previously described herein. Electrical pathways may also be provided between the processed semiconductor structures 120, 160A, 160B, 160C through the first metallization layer 124', the through wafer interconnects 130, and the second metallization layer 154 to conductive features of the additional substrate 170, and such additional electrical pathways also may be used for conveying electrical power and/or electrical signals therebetween.

In the embodiments described hereinabove, conductive features (such as conductive pads) of the additional processed semiconductor structures 160A, 160B, 160C are structurally and electrically coupled to the through wafer interconnects 130 and 130' using the conductive micro-bumps or micro-balls 162. Similarly, conductive features 156 of the second metallization layer 154 are structurally and electrically coupled to conductive features of the additional substrate 170 using conductive bumps or balls 172. In additional embodiments of the disclosure, the conductive features of the additional processed semiconductor structures 160A, 160B, 160C may be structurally and electrically coupled to the through wafer interconnects 130 using a metal-to-metal direct bonding process. Similarly, conductive features 156 of the second metallization layer 154 may be structurally and electrically coupled to conductive features of the additional substrate 170 using a metal-to-metal direct bonding process. It should be noted that direct bonding methods may have a reduced bonding pitch compared with the micro-bump technology described herein, and may be employed in additional embodiments of the disclosure. Such a reduced bonding pitch may allow for a higher input/output (I/O) density between the bonded device structures.

Figure 11:
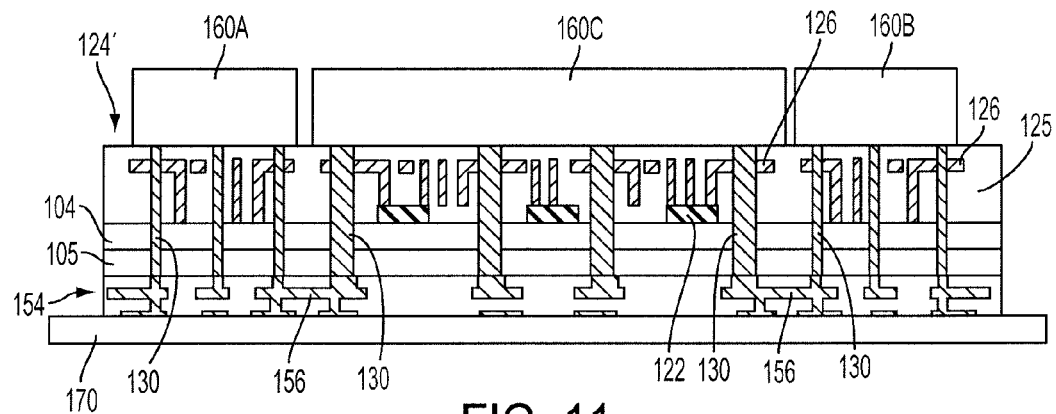
FIG. 11 is a simplified cross-sectional view of a processed semiconductor structure similar to that illustrated in FIG. 10F, but illustrating processed semiconductor structures directly bonded to a first metallization layer over a first side of the SeOI substrate, and another substrate directly bonded to a second metallization layer over a second side of the SeOI substrate.

For example, FIG. 11 illustrates an embodiment of a bonded semiconductor structure similar to that of FIG. 10F, but wherein metal-to-metal direct bonding processes have been used to bond conductive features of the additional processed semiconductor structures 160A, 160B, 160C to the through wafer interconnects 130, and to bond conductive features 156 of the second metallization layer 154 to conductive features of the additional substrate 170. Such direct bonding processes also may be used to form bonded semiconductor structures like those shown in FIGS. 6F, 7F, and 9F.

The metal-to-metal direct bonding processes may be carried out at a temperature or temperatures below about 400° C., or even below about 350° C. in some embodiments of the disclosure, so as to avoid causing thermal damage to any device structures in the processed semiconductor structures 120, 160A, 160B, 160C. In some embodiments, the bonding processes may comprise an ultra-low temperature direct bonding process, and may comprise a surface assisted direct bonding process, as those processes were previously defined herein.

Figure 12:
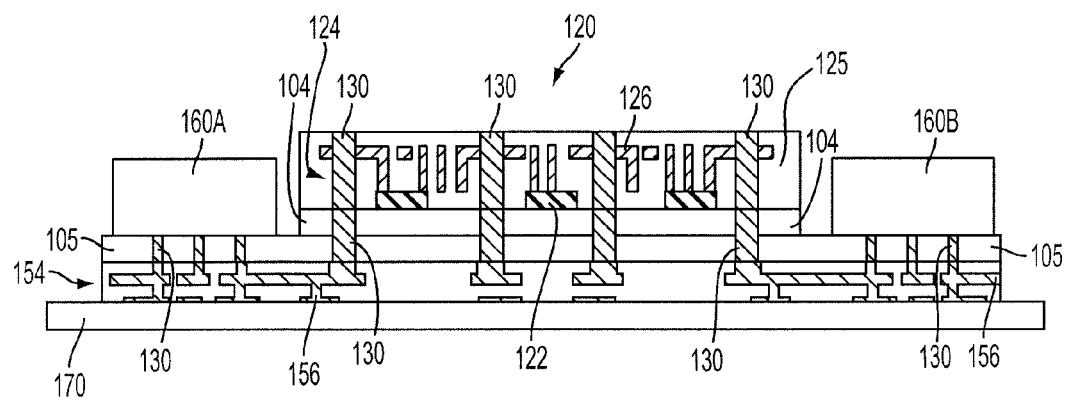
FIG. 12 is a simplified cross-sectional view of a processed semiconductor structure similar to that illustrated in FIG. 7F, but illustrating processed semiconductor structures directly bonded over a first side of the SeOI substrate, and another substrate directly bonded to a metallization layer over a second side of the SeOI substrate.

As another example, FIG. 12 illustrates an embodiment of a bonded semiconductor structure similar to that of FIG. 7F, but wherein an oxide-to-oxide direct bonding process have been used to bond the additional processed semiconductor structures 160A, 160B to the layer of electrically insulating material 105. As in FIG. 11, a metal-to-metal direct bonding process may be used to bond conductive features 156 of the second metallization layer 154 to conductive features of the additional substrate 170. Methods similar to those previously described with reference to FIGS. 7A through 7F, but somewhat modified, may be used to form the bonded semiconductor structure of FIG. 12. For example, to form the bonded semiconductor structure of FIG. 12, portions of the first metallization layer 124 may be removed as previously described with reference to FIG. 7E. These processes, however, also may be used to remove portions of the layer of semiconductor material 104 in such regions, so as to expose the layer of electrically insulating material 105, which may be formed to comprise an oxide. The additional processed semiconductor structures 160A, 160B then may be directly bonded to the layer of electrically insulating material 105 in an oxide-to-oxide direct bonding process. Additionally, at least the through wafer interconnects 130 that are to be interconnected to the additional processed semiconductor structures 160A, 160B may be formed subsequent to bonding the additional processed semiconductor structures 160A, 160B to the layer of electrically insulating material 105 in the oxide-to-oxide direct bonding process, and prior to formation of the second metallization layer 154. Forming those through wafer interconnects 130 after the direct bonding process may improve the quality of the electrical connection established between those through wafer interconnects 130 and the respective conductive features of the additional processed semiconductor structures 160A, 160B to which they are coupled.

The oxide-to-oxide direct bonding processes may be carried out at a temperature or temperatures below about 400° C., or even below about 350° C. in some embodiments of the disclosure, so as to avoid causing thermal damage to any device structures in the processed semiconductor structures 120, 160A, 160B. In some embodiments, the bonding processes may comprise an ultra-low temperature direct bonding process, and may comprise a surface assisted direct bonding process, as those processes were previously defined herein.

Similar oxide-to-oxide direct bonding processes also may be used to form bonded semiconductor structures like those shown in FIGS. 6F, 9F, and 10F.

The embodiments of the disclosure may be used to provide direct, and continuous electrical pathways between processed semiconductor structures carried by at least a portion of an SeOI-type substrate, which electrical pathways extend only through conductive features (e.g., pads, traces, and vias) that are also carried by the at least a portion of the SeOI-type substrate, and do not pass through any portion of another higher level substrate to which the at least a portion of the SeOI-type substrate is attached, such as the additional substrate 170. Such electrical pathways may be shorter compared to previously known configurations, and may provide improvements in signal speed and/or electrical power efficiency.

Additional non-limiting example embodiments of the disclosure are described below:

Embodiment 1: A method of forming a semiconductor device, comprising: providing a substrate, the substrate comprising a layer of semiconductor material on a layer of electrically insulating material; forming a first metallization layer comprising a plurality of electrically conductive features on the substrate over a first side of the layer of semiconductor material opposite the layer of electrically insulating material; forming a plurality of through wafer interconnects at least partially through the substrate, and forming at least one through wafer interconnect of the plurality of through wafer interconnects to extend through each of the metallization layer and the layer of semiconductor material; forming a second metallization layer comprising a plurality of electrically conductive features on the substrate over a second side of the layer of semiconductor material opposite the first side of the layer of semiconductor material; and providing an electrical pathway extending continuously through the first metallization layer, the substrate, and the second metallization layer between a first processed semiconductor structure carried by the substrate on the first side of the layer of semiconductor material and a second processed semiconductor structure carried by the substrate on the first side of the layer of semiconductor material.

Embodiment 2: The method of Embodiment 1, wherein providing the substrate comprises selecting the substrate to comprise a semiconductor-on-insulator (SeOI) substrate.

Embodiment 3: The method of Embodiment 2, wherein selecting the substrate to comprise a semiconductor-on-insulator (SeOI) substrate comprises selecting the substrate to comprise a silicon-on-insulator (SeOI) substrate.

Embodiment 4: The method of any one of Embodiments 1 through 3, wherein the layer of semiconductor material has an average total thickness of about 1 micron or less, and wherein the layer of electrically insulating material comprises a layer of oxide material having an average total thickness of about 300 nm or less.

Embodiment 5: The method of any one of Embodiments 1 through 4, wherein forming the at least one through wafer interconnect of the plurality of through wafer interconnects to extend through each of the metallization layer and the layer of semiconductor material further comprises forming the at least one through wafer interconnect of the plurality of through wafer interconnects to extend through the layer of electrically insulating material.

Embodiment 6: The method of any one of Embodiments 1 through 5, further comprising bonding at least one of the first processed semiconductor structure and the second processed semiconductor structure to the substrate over the first side of the layer of semiconductor material.

Embodiment 7: The method of Embodiment 6, wherein bonding at least one of the first processed semiconductor structure and the second processed semiconductor structure to the substrate over the first side of the layer of semiconductor material comprises directly bonding the at least one of the first processed semiconductor structure and the second processed semiconductor structure to the substrate in a metal-to-metal direct bonding process at a temperature or temperatures below about 400° C.

Embodiment 8: The method of any one of Embodiments 1 through 7, further comprising forming at least one of the first processed semiconductor structure and the second processed semiconductor structure in situ on the substrate over the first side of the layer of semiconductor material.

Embodiment 9: The method of any one of Embodiments 1 through 8, wherein providing an electrical pathway further comprises configuring the electrical pathway to extend through at least one conductive feature of the first metallization layers, through the at least one through wafer interconnect of the plurality of through wafer interconnects extending through each of the metallization layer and the layer of semiconductor material, through at least one conductive feature of the second metallization layer, and through at least another through wafer interconnect of the plurality of through wafer interconnects.

Embodiment 10: The method of any one of Embodiments 1 through 9, further comprising structurally and electrically connecting at least one conductive feature of the second metallization layer to a conductive feature of another substrate.

Embodiment 11: The method of any one of Embodiments 1 through 10, further comprising individually selecting each of the first processed semiconductor structure and the second processed semiconductor structure from the group consisting of an electronic signal processor device, an electronic memory device, an electromagnetic radiation emitter device, and an electromagnetic radiation receiver device.

Embodiment 12: The method of Embodiment 11, further comprising: selecting the first processed semiconductor structure to comprise an electronic signal processor device; and selecting the second processed semiconductor structure to comprise at least one of an electronic memory device, a light-emitting diode, a laser-emitting diode, and a solar cell.

Embodiment 13: A semiconductor structure, comprising: a substrate comprising a layer of semiconductor material; a first metallization layer on the substrate over a first side of the layer of semiconductor material; a second metallization layer on the substrate over a second side of the layer of semiconductor material opposite the first side of the layer of semiconductor material; a plurality of through wafer interconnects extending at least partially through each of the first metallization layer and the layer of semiconductor material of the substrate; a first processed semiconductor structure carried by the substrate over the first side of the layer of semiconductor material; and a second processed semiconductor structure carried by the substrate over the first side of the layer of semiconductor material; wherein an electrical pathway extends from the first processed semiconductor structure, through a conductive feature of the first metallization layer, through a first through wafer interconnect of the plurality of through wafer interconnects, through a conductive feature of the second metallization layer, and through a second through wafer interconnect of the plurality of through wafer interconnects to the second processed semiconductor structure.

Embodiment 14: The semiconductor structure of Embodiment 13, wherein the substrate comprises a semiconductor-on-insulator (SeOI) substrate.

Embodiment 15: The semiconductor structure of Embodiment 14, wherein the semiconductor-on-insulator (SeOI) substrate comprises a silicon-on-insulator (SeOI) substrate.

Embodiment 16: The semiconductor structure of Embodiment 14 or Embodiment 15, wherein the layer of semiconductor material has an average total thickness of about 1 micron or less.

Embodiment 17: The semiconductor structure of any one of Embodiments 14 through 16, wherein at least one through wafer interconnect of the plurality of through wafer interconnects extends at least partially through a layer of electrically insulating material of the SeOI substrate.

Embodiment 18: The semiconductor structure of any one of Embodiments 13 through 17, wherein at least one of the first processed semiconductor structure and the second processed semiconductor structure is bonded to the substrate over the first side of the layer of semiconductor material.

Embodiment 19: The semiconductor structure of Embodiment 18, wherein a metal feature of the at least one of the first processed semiconductor structure and the second processed semiconductor structure is directly bonded to at least one through wafer interconnect of the plurality of through wafer interconnects.

Embodiment 20: The semiconductor structure of any one of Embodiments 13 through 19, wherein the electrical pathway extends continuously between the first processed semiconductor structure and the second processed semiconductor structure through the substrate, the first metallization layer, and the second metallization layer.

Embodiment 21: The semiconductor structure of any one of Embodiments 13 through 20, wherein at least one conductive feature of the second metallization layer is electrically coupled to a conductive feature of another substrate.

Embodiment 22: The semiconductor structure of any one of Embodiments 13 through 21, wherein each of the first processed semiconductor structure and the second processed semiconductor structure comprises one of an electronic signal processor device, an electronic memory device, an electromagnetic radiation emitter device, and an electromagnetic radiation receiver device.

Embodiment 23: The semiconductor structure of Embodiment 22, wherein: the first processed semiconductor structure comprises an electronic signal processor device; and the second processed semiconductor structure comprises at least one of an electronic memory device, a light-emitting diode, a laser-emitting diode, and a solar cell.

The example embodiments of the disclosure described above do not limit the scope of the invention. These are merely examples of embodiments of the invention, which is defined by the scope of the appended claims and their legal equivalents. Any equivalent embodiments are intended to be within the scope of this invention. Indeed, various modifications of the disclosure, in addition to those shown and described herein, such as alternative useful combinations of the elements described, will become apparent from the description to those skilled in the art. Such modifications are also intended to fall within the scope of the appended claims. Headings are used herein for clarity and convenience only, and do not limit the scope of the claims below.

What is claimed is:

1. A semiconductor structure, comprising:
    a substrate comprising a layer of semiconductor material;
    a first metallization layer on the substrate over a first side of the layer of semiconductor material;
    a second metallization layer on the substrate over a second side of the layer of semiconductor material opposite the first side of the layer of semiconductor material;
    a plurality of through wafer interconnects extending at least partially through each of the first metallization layer and the layer of semiconductor material of the substrate;
    a first processed semiconductor structure carried by the substrate over the first side of the layer of semiconductor material; and
    a second processed semiconductor structure carried by the substrate over the first side of the layer of semiconductor material;
    wherein an electrical pathway extends from the first processed semiconductor structure, through a conductive feature of the first metallization layer, through a first through wafer interconnect of the plurality of through wafer interconnects, through a conductive feature of the second metallization layer, and through a second through wafer interconnect of the plurality of through wafer interconnects to the second processed semiconductor structure.

2. The semiconductor structure of claim 1, wherein the substrate comprises a semiconductor-on-insulator (SeOI) substrate.

3. The semiconductor structure of claim 2, wherein the semiconductor-on-insulator (SeOI) substrate comprises a silicon-on-insulator (SOI) substrate.

4. The semiconductor structure of claim 2, wherein the layer of semiconductor material has an average total thickness of about one micron or less.

5. The semiconductor structure of claim 2, wherein at least one through wafer interconnect of the plurality of through wafer interconnects extends at least partially through a layer of electrically insulating material of the SeOI substrate.

6. The semiconductor structure of claim 1, wherein at least one of the first processed semiconductor structure and the second processed semiconductor structure is bonded to the substrate over the first side of the layer of semiconductor material.

7. The semiconductor structure of claim 6, wherein a metal feature of the at least one of the first processed semiconductor structure and the second processed semiconductor structure is directly bonded to at least one through wafer interconnect of the plurality of through wafer interconnects.

8. The semiconductor structure of claim 1, wherein the electrical pathway extends continuously between the first processed semiconductor structure and the second processed semiconductor structure through the substrate, the first metallization layer, and the second metallization layer.

9. The semiconductor structure of claim 1, wherein at least one conductive feature of the second metallization layer is electrically coupled to a conductive feature of another substrate.

10. The semiconductor structure of claim 1, wherein each of the first processed semiconductor structure and the second processed semiconductor structure comprises one of an electronic signal processor device, an electronic memory device, an electromagnetic radiation emitter device, and an electromagnetic radiation receiver device.

11. The semiconductor structure of claim 10, wherein:
    the first processed semiconductor structure comprises an electronic signal processor device; and
    the second processed semiconductor structure comprises at least one of an electronic memory device, a light-emitting diode, a laser-emitting diode, and a solar cell.

* * * * *